United States Patent
Li et al.

(10) Patent No.: US 9,323,158 B2
(45) Date of Patent: Apr. 26, 2016

(54) METHOD OF EXTREME ULTRAVIOLET LITHOGRAPHY PROJECTION OBJECTIVE

(75) Inventors: Yanqiu Li, Beijing (CN); Fei Liu, Beijing (CN)

(73) Assignee: National Institute of Metrology, Beijing (CN)

(*) Notice: Subject to any disclaimer, the term of this patent is extended or adjusted under 35 U.S.C. 154(b) by 153 days.

(21) Appl. No.: 14/363,334

(22) PCT Filed: Feb. 28, 2012

(86) PCT No.: PCT/CN2012/000254
§ 371 (c)(1),
(2), (4) Date: Jun. 6, 2014

(87) PCT Pub. No.: WO2013/082851
PCT Pub. Date: Jun. 13, 2013

(65) Prior Publication Data
US 2014/0368805 A1    Dec. 18, 2014

(30) Foreign Application Priority Data

Dec. 7, 2011  (CN) .......................... 2011 1 0404929

(51) Int. Cl.
*G03B 27/32*    (2006.01)
*G03F 7/20*    (2006.01)
*G02B 17/06*    (2006.01)

(52) U.S. Cl.
CPC .......... *G03F 7/7015* (2013.01); *G02B 17/0657* (2013.01); *G03F 7/705* (2013.01); *G03F 7/70216* (2013.01)

(58) Field of Classification Search
CPC ... G03F 7/7015; G03F 7/70216; G03F 7/705; G02B 17/0657
See application file for complete search history.

(56) References Cited

U.S. PATENT DOCUMENTS 5,071,240 A    12/1991  Ichihara et al.
5,815,310 A *  9/1998  Williamson ....... G02B 17/0657
                                                 359/365

(Continued)

FOREIGN PATENT DOCUMENTS

CN    101226272 A    7/2008

OTHER PUBLICATIONS

International Search Report for International Application No. PCT/CN2012/000254, mailed on Sep. 20, 2012.

(Continued)

*Primary Examiner* — Deoram Persaud
(74) *Attorney, Agent, or Firm* — Limin Wen

(57) ABSTRACT

A design method of extreme ultraviolet lithography projection objective comprises: determining the optical design parameters of the lithography projection objective, setting the projection objective to include six lenses and an aperture diaphragm, and dividing the six lenses into the three groups according to the beam propagation direction; determining the radii and the intervals of the first and third groups, respectively; and determining the radii and the intervals of the second group of lenses according to the parameters of the foregoing two groups of lenses. The design method has the advantage of avoiding the blindness in revising and error testing of the existing structure of the conventional optical design method by calculating lens structures that meet the parameter conditions, so that light rays can be selected conveniently according to the special requirements of optical processing detection, and a mass of searches and judgments can be avoided.

4 Claims, 14 Drawing Sheets

(56) References Cited

U.S. PATENT DOCUMENTS

| | | | | |
|---|---|---|---|---|
| 6,240,158 | B1* | 5/2001 | Oshino | G03F 7/70058 378/205 |
| 7,224,441 | B2 | 5/2007 | Sasaki | |
| 7,692,767 | B2* | 4/2010 | Takahashi | G02B 17/0663 355/53 |
| 7,719,772 | B2* | 5/2010 | Mann | G02B 17/0663 359/365 |
| 8,094,380 | B2* | 1/2012 | Mann | B82Y 10/00 359/649 |
| 8,194,230 | B2* | 6/2012 | Chan | G02B 5/0891 355/43 |
| 8,629,972 | B2* | 1/2014 | Zellner | G03F 7/70233 355/53 |
| 8,902,406 | B2* | 12/2014 | Walser | 355/51 |
| 8,967,817 | B2* | 3/2015 | Mann | 355/45 |
| 2004/0189965 | A1* | 9/2004 | Takahashi | G02B 17/0657 355/67 |
| 2004/0189968 | A1* | 9/2004 | Terasawa | G02B 17/0657 355/67 |
| 2006/0232867 | A1* | 10/2006 | Mann | G02B 13/143 359/858 |
| 2008/0170310 | A1* | 7/2008 | Mann | G02B 17/0663 359/839 |

OTHER PUBLICATIONS

M.F. Bal, Next-Generation Extreme Ultraviolet Lithographic Projection Systems[D], Delft: Technique University Delft, 2003.
Fei Liu, Yanqiu Li, Design of High Numerical Aperture Projection Objective for Industrial Extreme Ultraviolet Lithography, Acta Optica Sinica, Feb. 2011, pp. 022003-1-022003-7, vol. 31, No. 2.
US 5,815,319, 09/1998, Williamson (withdrawn)

* cited by examiner

METHOD OF EXTREME ULTRAVIOLET LITHOGRAPHY PROJECTION OBJECTIVE

CROSS-REFERENCE TO RELATED APPLICATION

This application is a U.S. National Phase Application of PCT International Application No. PCT/CN2012/000254 filed on Feb. 28, 2012, which claims priority to Chinese Patent Application No. 201110404929.7, filed on Dec. 7, 2011, the contents of each of which are incorporated herein by reference in their entirety for all purposes.

FIELD OF THE INVENTION

The present invention relates to a method for extreme ultraviolet lithography (EUVL) projection objective design.

BACKGROUND OF THE INVENTION

For the IC manufacturing process, the highly précised projection objective is used to project the pattern on the mask to the wafer with resist. The existing deep ultraviolet (DUV) lithography takes the laser source of 193 nm wavelength. With the assistance of resolution enhancement technology like off-axial illumination, phase shift mask, and optical proximity correction, the DUV lithography can achieve the 45 nm node of the industrial IC manufacturing. But for the 32 nm node and below, extreme ultraviolet (EUV) lithography is the most promising next generation tech. The wavelength of EUV lithography is about 11~15 nm. Like the DUV lithography, deep ultraviolet lithography (DUVL) also takes the step-scan model.

EUVL system includes plasma source, reflective illumination system, reflective mask, reflective projection objective, and the wafer covered with EUV resist, and the scanner. The ray beams emerged from the source get reshaped and uniformed by the illumination system, and then illuminate on the reflective mask. The reflected ray beams from the mask incident into the projection objective, and finally generate a pattern on the wafer with resist.

Typical EUVL projection objectives are co-axial optical systems. The object, image, and all the reflective elements are rotational symmetry. This feature is good for the correction of aberration and the manufacturing of the objective. Because of the folding and obstruction of the light path, the projection objective takes an off-axial field on object and image plane. Generally, there are several constraints for objective design except for known ones: 1. Achievable setting of a aperture diaphragm, which may set on one of the lenses 2~5; 2. Enough working distance on both object and image side to ensure the space for mask and wafer setting; 3 non-obstruction design in the light path, all the used area on each element has enough space from the light path passed near it. 4. Suitable light path for the reflective mask, the incidental and emergent angle of ray beams on mask should be large enough to avoid obstruction with each other. 5. High resolution. 6. Extremly small distortions. 7. Teleconcentricity on the image plane.

Published document (M. F. Bal, Next-Generation Extreme Ultraviolet Lithographic Projection Systems[D], Delft: Technique University Delft, 2003) disclosed a method for EUVL projection objective design. The method makes exhaustive search on the first order parameters of the lenses of the objective with constraints of the magnification, conjugation relationship of the object and image, and then sifts the results of the exhaustive search by obstruction situation judgment, finally gets available structures of the objective, as "initial structures" for further optimization and design. The disadvantage of this method is that the calculation needed is too large for a common PC. It will take about a week to find an available structure.

SUMMARY OF THE INVENTION

As a solution to these and other objects, the method for EUVL projection objective design has the following steps:

STEP 101 Setting the optical parameters of the projection objective: object side numerical aperture NAO, the magnification of the objective M, the image side numerical aperture NAI, the object field height YOB, the image field height YIM; and the incidental angle of chief ray on object side CA;

STEP 102 The projection objective is set besides the mask and wafer plane. The objective includes six lenses and one aperture diaphragm. From the mask side along the beam propagation direction, the position relationship of them is: the first lens M1, aperture diaphragm, the second lens M2, the third lens M3, the fourth lens M4, the fifth lens M5, and the sixth lens M6. And the aperture diaphragm is set on the second lens M2;

STEP 103 Setting the ratio of the object field height to the separation between the mask and the first lens M1 ratio$_1$; setting the ratio of the separation between the first lens M1 and the second lens M2 to the separation between the mask and the first lens M1 ratio$_2$; the clear space between the first lens M1 and the ray beam emerged from M2 CLEAPE1; the working distance between wafer and the sixth lens M6 WDI; the ratio of WDI to the separation between the fifth lens M5 and the sixth lens M6 ratio$_3$; the clear space between the sixth lens M6 and the incidental ray beam onto the fifth lens M5 CLEAPE6; the clear space between the fifth lens M5 and the emerged ray beam from M6 CLEAPE5;

STEP 104 Setting the separation between the mask and the first lens M1 as $-l_1$, then there is $|-l_1|=$YOB/ratio$_1$; setting the separation between the first lens M1 and the second lens M2 as $-d_1$, then there is $|-d_1|=$YOB/ratio$_1 \cdot$ratio$_2$;

STEP 105 Denoting the radius of the first lens M1 as $r_1$, then there is:

$$r_1 = h_{z1} \Big/ \sin\left(\frac{\arctan(h_{z1}/(-d_1+z_{z1}))}{2} - \frac{CA}{2}\right)$$

Wherein the $h_{z1}$ denotes the height of chief ray RAY1 on the first lens M1, and the $z_{z1}$ denotes the axial distance of the incidental point of chief ray RAY1 on the first lens M1 to the vertex of the first lens M1;

STEP 106 Denoting the radius of the second lens M2 as $r_2$, then there is:

$$r_2 = h_{a2} \Big/ \sin\left(\frac{U_{a2}}{2} - \frac{\arctan\left(\frac{h_{b1}-CLEAPE1-h_{a2}}{-d_1}\right)}{2}\right)$$

Wherein the $U_{a2}$ denotes the slope angle of the upper marginal ray RAY2 on the first lens M1, the $h_{a2}$ denotes the height of the upper marginal ray RAY2 on the second lens M2, and the $h_{b1}$ denotes the height of the lower marginal ray RAY3 on the first lens M1;

STEP 107 Denoting the interval between the fifth lens M5 and the sixth lens M6 as $d_5$, then there is $|d_5|=$WDI$\cdot$ratio$_3$;

STEP 108 Setting a dummy surface D1 in the light path of the objective. The position of the dummy surface D1 is exactly the same position as the fifth lens M5. Make sure that the incidental chief ray RAY1 on the sixth lens M6 is parallel to the optical axial OA. Denote the radius of the sixth lens M6 as $r_6$, then there is:

$$r_6 = h_{b6} \bigg/ \sin\left(\frac{\arctan((h_{b6} - (h_{6D1} - CLEAPE5))/(-d_5 - z_{b6}))}{2} + \frac{U'_{b6}}{2}\right)$$

Wherein the $h_{b6}$ denotes the height of the lower marginal ray RAY3 on the sixth lens M6, the $h_{bD1}$ denotes the height of the lower marginal ray RAY3 on the dummy surface D1, the $z_{b6}$ denotes the axial distance between incidental point of the lower marginal ray on the sixth lens M6 and the vertex of the sixth lens M6, and the $U'_{b6}$ denotes the slope angle of the lower marginal ray RAY3 on the sixth lens M6;

STEP 109 Denoting the radius of the fifth lens M5 as $r_5$, then there is:

$$r_5 = h_{b5} \bigg/ \sin\left(\frac{\arctan((h_{b5} - (h_{a6} - CLEAPE6))/(-d_5 - z_{a6}))}{2} + \frac{U'_{b5}}{2}\right)$$

Wherein the $h_{b5}$ denotes the height of lower marginal ray RAY3 on the fifth lens M5, the $h_{a6}$ denotes the height of lower marginal ray RAY3 on the sixth lens M6, the $U'_{b5}$ denotes the slope angle of the lower marginal ray RAY3 on the fifth lens M5, the $z_{a6}$ denotes the axial distance between the incidental point of the upper marginal ray RAY2 on the sixth lens M6 and the vertex of the sixth lens M6, and the $U'_{b5}$ denotes the slope angle of the lower marginal ray RAY3 on the fifth lens M5;

STEP 110 Setting the radius of the third lens M3 as $r_3$, according to the object-image conjugation relationship, the magnification relationship, the pezval sum condition and the conjugation relationship of the entrance and exit pupil and the radii of the first lens M1, the second lens M2, the fifth lens M5, the sixth lens M6, and the separations between them, the radius of the fourth lens M4 denoted as $r_4$, the separation between the third lens M3 and the fourth lens M4 denoted as $d_3$, the separation between the second lens M2 and the third lens M3 denoted as $l_3$, and the separation between the fourth lens M4 and the fifth lens M5 denoted as $d_5$, exactly the image distance of the fourth lens M4 denoted as $l'_4$, can be calculated;

STEP 111 Gathering the radii of the six lenses and its position relationships from the steps mentioned above, people can get the whole design of the EUVL projection objective.

Furthermore, the invention separate the projection objective into three lens groups, the first lens group G1 includes the first lens M1 and the second lens M2; the second lens group G2 includes the third lens M3 and the fourth lens M4; the third lens group G3 includes the fifth lens M5 and the sixth lens M6; wherein the process of choosing the radius of the third lens M3 denoted as $r_3$ is: the second lens group G2 is taken as an independent optical system, and the magnification of G2 is $\beta$=M. The entrance pupil distance of G2 $enp_2$ equals to the exit pupil distance ENP1, i.e. $enp_2$=ENP1, and the exit pupil distance of G2 equals to the entrance pupil distance of G3, i.e. $exp_2$=EXP3. 1500 mm>$(-l_3-enp_2)$>0 and 0>$d_3$>1500 mm are taken as constraint conditions, and the available range of the radius of the third lens $r_3$ is decided by the object-image conjugation relationship, the magnification condition, the pezval sum condition, and the conjugation relationship of the entrance and exit pupil. The radius of the third lens M3 denoted as $r_3$ is picked up from the available range.

Furthermore, the details of the STEP 108 are:

STEP 201 Choose the radius of the third lens M3 as $r_3$, set the error factor $\xi_B$ and $\xi_{exp_2}$, then take $\beta(1)$=M and $exp_2(1)$=EXP1, set the loop time k=1;

STEP 202 Take the parameters $\beta(k)$, $exp_2(k)$, and the chosen $r_3$, with the conjugation relationship of the object and the image, the magnification, the pezval sum condition, and the conjugation relationship of the entrance and exit pupil, then get the structural parameters $d_3(k)$, $l_3(k)$, $l'_4(k)$, and $r_4(k)$ of the second lens group G2;

STEP 203 Put the $r_3$, $d_3(k)$, $l_3(k)$, $l'_4(k)$, and $r_4(k)$ into the optical design software CODEV to obtain the magnification M(k) and the real exit pupil distance EXP2(k) of the second lens group G2;

STEP 204 If $|EXP2(k)-EXP1|\le\xi_{exp_2}$ and $|M(k)-M|\le\xi_B$, end the optimization process, and take the current $r_3$, $d_3(k)$, $l_3(k)$, $l'_4(k)$, and $r_4(k)$ as the structural parameters of the second lens group G2. If not, go to the STEP 205;

STEP 205 Take $\beta(k+1)=\beta(k)=\beta(k)\cdot[M/M(k)]^\sigma$, and $exp_2(k+1)=exp_2(k)\cdot[EXP1/EXP2(k)]^\sigma$, where $\sigma\le 1$, making k=k+1, and go back to the STEP 202.

The present invention has the following advantages: it is one object of the invention is to provide a complete method for the design of the initial structures of EUVL projection objective that allows to generate EUVL projection objective designs according to different parameter constraints avoiding the aimlessness in the traditional modification and trial process with the existing structures.

It is another object of the invention to further avoid the massive searching and judging by choosing specific series of structures which suit the demands of optical testing and manufacturing.

It is another object of the invention to further narrow down the searching range of the parameters, lower down the load of calculation and substantially shrink the step length of searching by making group by group search for the whole objective candidates.

It is another object of the invention to provide a method to obtain complete initial structures for the EUVL reflective objectives with six lenses, while asking for no existing reflective optical structures as a starting point.

It is another object of the invention to avoid misjudgment of the obstruction situation caused by the differences between the real light path and the axial light path by turning to real ray trace model.

The invention is explained in more detail below on the basis of exemplary embodiments illustrated in the accompanying figures.

BRIEF DESCRIPTION OF THE DRAWINGS

For a more complete understanding of the present disclosure and its advantages, reference is now made to the following description, taken in conjunction with the accompanying drawings, in which.

Wherein: 101—mask 102—wafer, 103—optical axial 104—chief ray 105—upper marginal ray 106—lower marginal ray 107—aperture diaphragm.

DETAILED DESCRIPTION OF THE EMBODIMENTS

First of all, the definition of the parameters should be clarified as following.

Real object point/image point are defined as the intersection of two marginal ray of the ray beam, real object height/image height are defined as the height of the non-axial real object point/image point; Real image plane/object plane are defined as the normal plane of the optical axial. Real entrance pupil distance is defined as distance between the real object plane and the real entrance pupil plane. Real exit pupil distance is defined as distance between the real image plane and the real exit pupil plane, where the real entrance/exit pupil planes are defined as the normal plane of the optical axial, meanwhile through the intersection of the chief ray and optical axial 103. For convenience, we take object/image point, object/image height, object/image plane, entrance/exit pupil plane as those non-axial parameters mentioned above for short. For axial parameters, there will be special notifications.

STEP 101 Setting the optical parameters of the projection objective: numerical aperture on object side NAO, the magnification of the objective M, the numerical aperture on image side NAI, the object field height YOB, the image field height YIM, the chief ray angle CA on the mask.

The relationship of the parameters mentioned above is:

NAO=NAI·|M|, YOB=YIM/|M|

Figure 1:
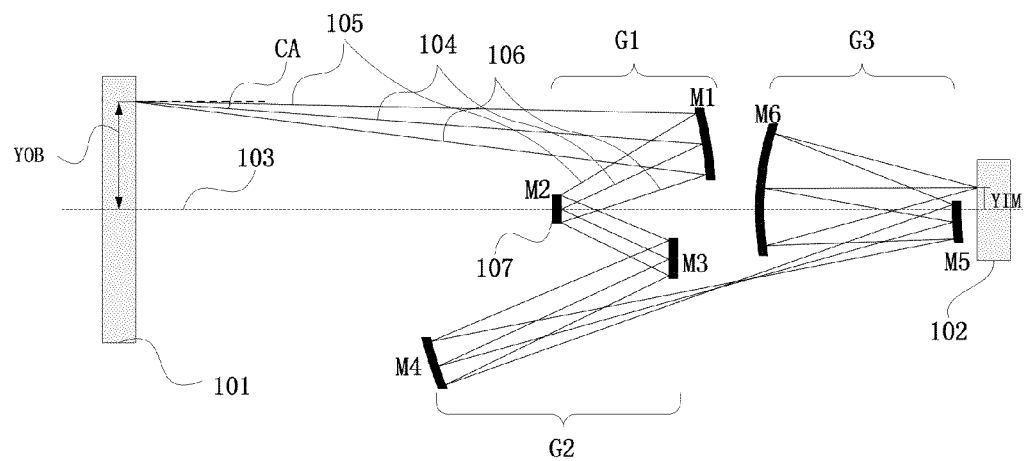
FIG. 1 is a schematic diagram of the EUVL projection objective with six lenses and its grouping strategy.

Determine the chief ray angle on the object side with the object side numerical aperture NAO. Because the mask for EUVL is reflective, the incident and emerged ray beam should not be blocked by each other, the chief ray 104 of the ray beam, the upper marginal ray 105 of the ray beam, and the lower marginal ray 106 of the ray beam must all be lower or upper than the height of the object field YOB (as shown in FIG. 1). To make sure that the light paths meet no obstruction, the range of the chief ray angle on the object side is |CA|>arcsin (NAO).

STEP 102 The projection objective is setting between the mask 101 and the wafer 102. It includes six lenses and one aperture diaphragm 107, the position relationships of the six lenses and the aperture diaphragm are: from the mask 101 along the beam propagation direction are successively the mask 101, and the first lens M1, the aperture diaphragm, the second lens M2, the third lens M3, the fourth lens M4, the fifth lens M5 and the sixth lens M6. The aperture diaphragm is set on the second lens M2 to make sure that the aperture diaphragm is achievable when the objective is manufactured.

STEP 103 Denote the ratio of the object field height to the separation between the mask 101 and the first lens M1 as ratio$_1$. Denote the ratio of the separation between the second lens M2 and the first lens M1 to the separation between the mask 101 and the first lens M1 as ratio$_2$. Denote the clear space between the first lens M1 and the ray beam emerged from the second lens M2 as CLEAPE1. Denote the distance between the wafer and the sixth lens M6 as WDI, and denote the ratio of the WDI to the interval between the fifth lens M5 and the sixth lens M6 as ratio$_3$. Denote the clear space between the sixth lens M6 and the incidental ray beam onto the fifth lens M5 as CLEAPE6, and denote the clear space between the fifth lens M5 and the ray beam emerged from the sixth lens M6 as CLEAPE5.

The EUVL projection objective is separated into three lens groups, the first lens group G1 includes the first lens M1 and the second lens M2; the second lens groups G2 includes the third lens M3 and the fourth lens M4; the third lens group G3 includes the fifth lens M5 and the sixth lens M6, as shown in FIG. 1.

STEP 104 Set the distance between the mask 101 and the first lens M1 as $-l_1$, then there is ratio$_1$=YOB/|$-l_1$|

|$-l_1$|=YOB/ratio$_1$

Set the separation between the second lens M2 and the first lens M1 as $-d_1$, then there is ratio$_2$=|$-d_1$|/|$-l_1$|=|$-d_1$|·ratio$_1$/YOB

|$-d_1$|=YOB/ratio$_1$·ratio$_2$

STEP 105 Denote the radius of the first lens M1 as $r_1$.

With the chief ray angle CA on the object plane and the condition of aperture diaphragm on the second lens M2, the radius of the first lens M1 $r_1$ for different ratio$_1$ and ratio$_2$ can be calculated. When the radius $r_1$ is decided, the clear space CLEAPE2 near the second lens M2 can be calculated by CODEV which is the software for optical design.

Figure 2:
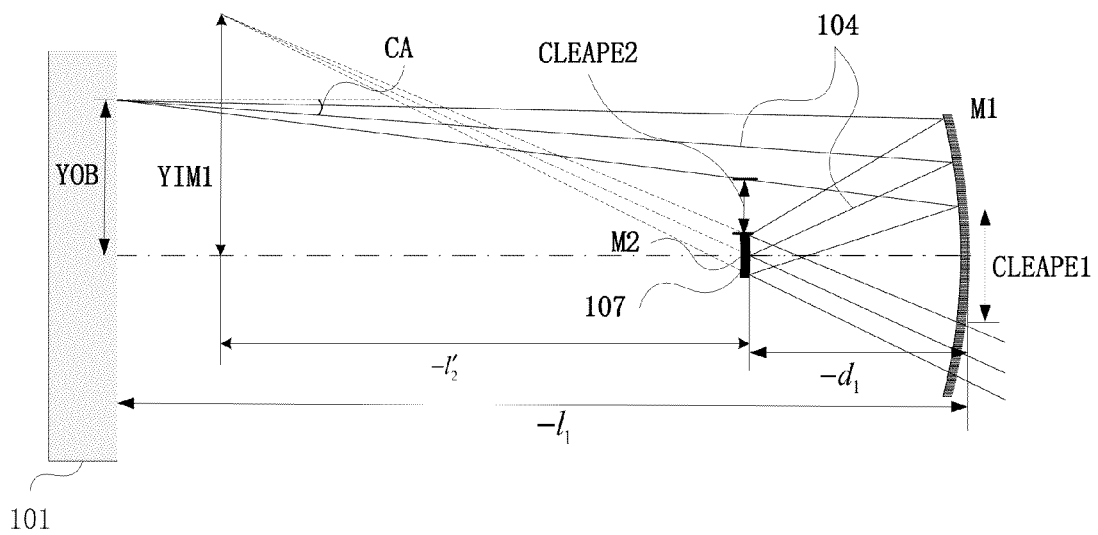
FIG. 2 is a schematic diagram of the light path of G1.

As shown in FIG. 2, the chief rays 104 emerges from the mask 101 and incidents into the first lens M1, and then incidents into the second lens M2. To make sure that the aperture diaphragm is physically achievable, the aperture diaphragm 107 of EUVL objective is put on the second lens M2, i.e. the chief ray 104 pass through the center of the third lens M2. With this condition, the radius of the first lens M1 $r_1$ under certain ratio$_1$ and ratio$_2$ can be calculated.

Figure 3:
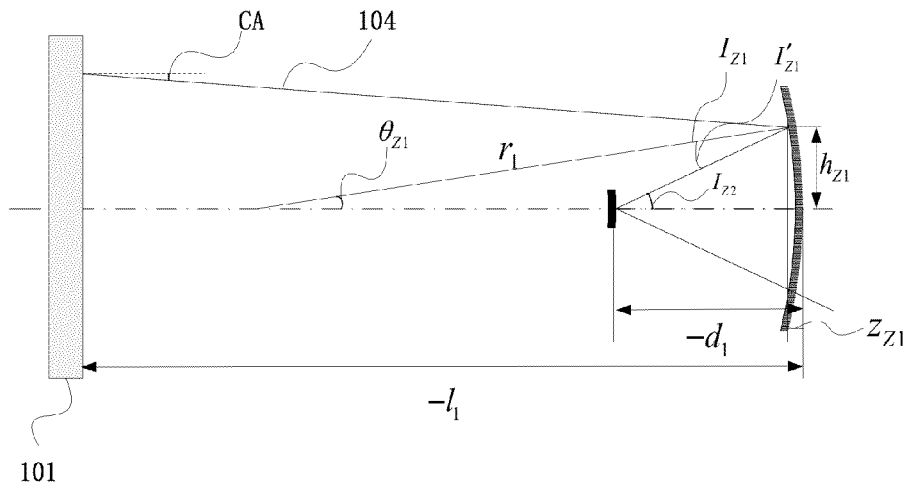
FIG. 3 is a diagram illustrating the calculation for the parameters of M1.

Refer to FIG. 3, with the real ray trace model, there is $$h_{z1}/r_1 = \sin\theta_{z1}$$
$$= \sin(I_{z2} - I'_{z1})$$
$$= \sin\left(I_{z2} - \frac{(CA + I_{z2})}{2}\right)$$
$$= \sin\left(\frac{I_{z2}}{2} - \frac{CA}{2}\right)$$
$$= \sin\left(\frac{\arctan(h_{z1}/(-d_1 + z_{z1}))}{2} - \frac{CA}{2}\right)$$

So, there is $$r_1 = h_{z1} \Big/ \sin\left(\frac{\arctan(h_{z1}/(-d_1 + z_{z1}))}{2} - \frac{CA}{2}\right)$$

Wherein the $\theta_{z1}$ denotes the slope angle of the normal at the intersection of chief ray RAY1 and the first lens M1; the $h_{z1}$ denotes the height of the chief ray RAY1 on the first lens M1; the $I_{z1}$ denotes the incidental angle of the chief ray RAY1 on the first lens M1; the $I'_{z1}$ denotes the reflective angle of the chief ray RAY1 on the first lens M1; the $I_{z2}$ denotes the slope angle of the chief ray RAY1 on the first lens M1; the $z_{z1}$ denotes the axial distance between incidental point of the upper marginal ray on the first lens M1 to the vertex of the first lens M1.

Figure 4:
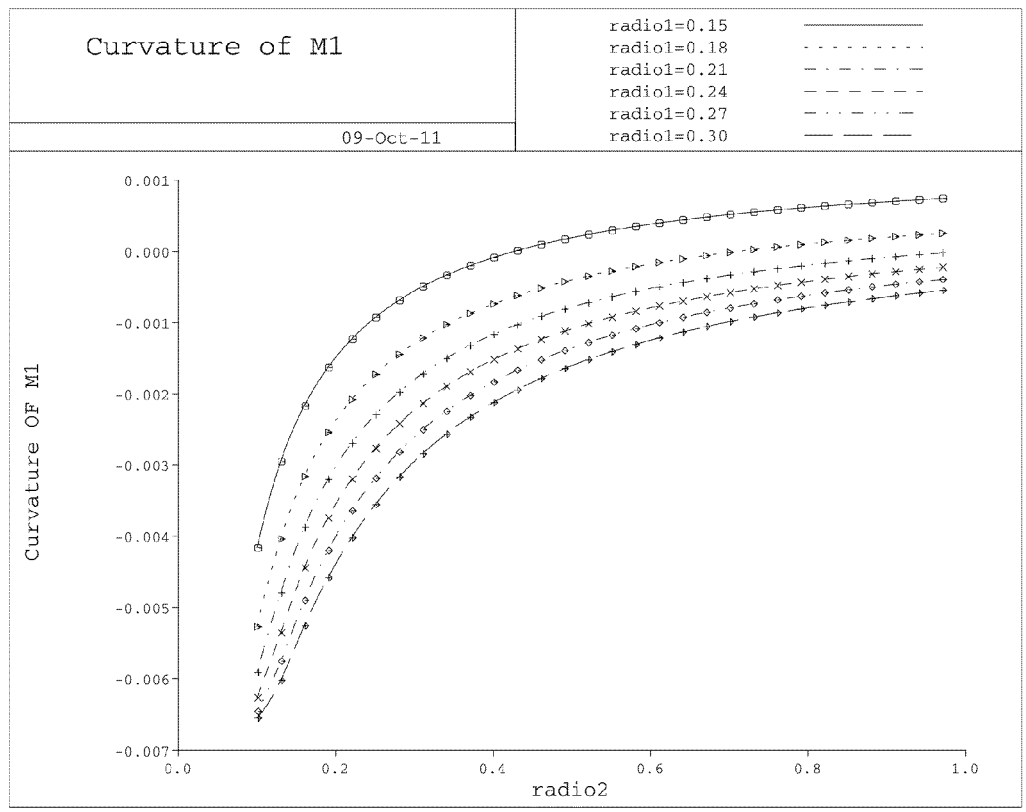
FIG. 4 is a diagram illustrating the $ratio_2$-dependent profile of the curvature of M1 $1/r_1$ under different $ratio_1$.

FIG. 4 is the diagram of $1/r_1$ versus ratio$_2$ under different ratio$_1$.

Figure 5:
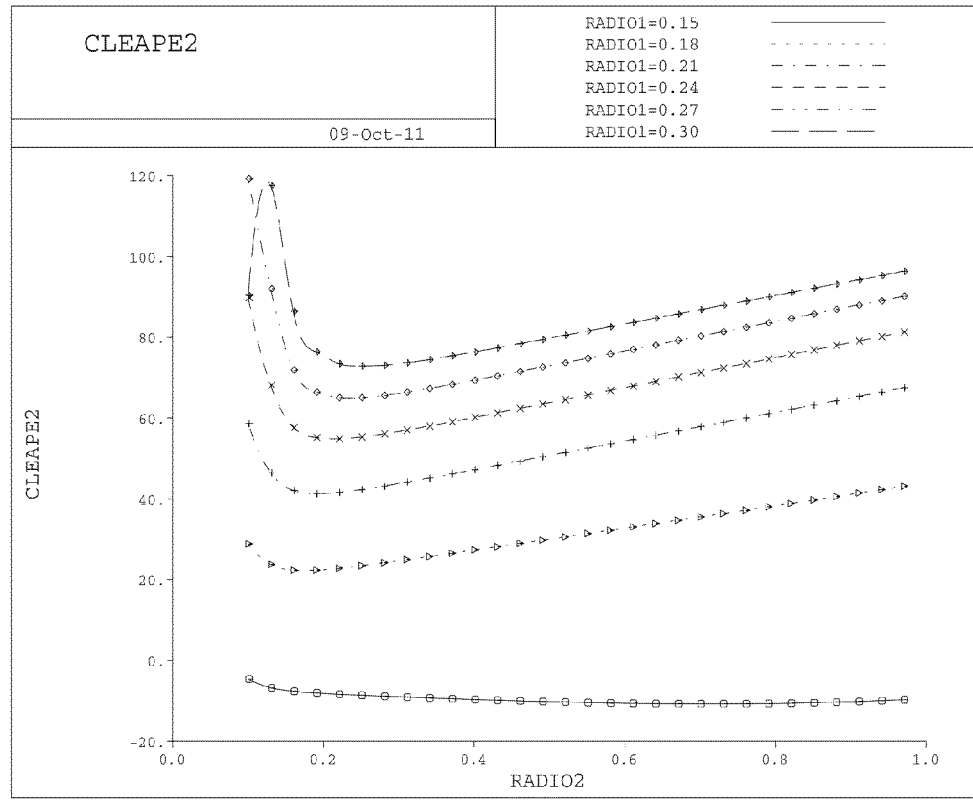
FIG. 5 is a diagram illustrating the $ratio_2$-dependent profile of the CLEAPE2 under different $ratio_1$.
Figure 6:
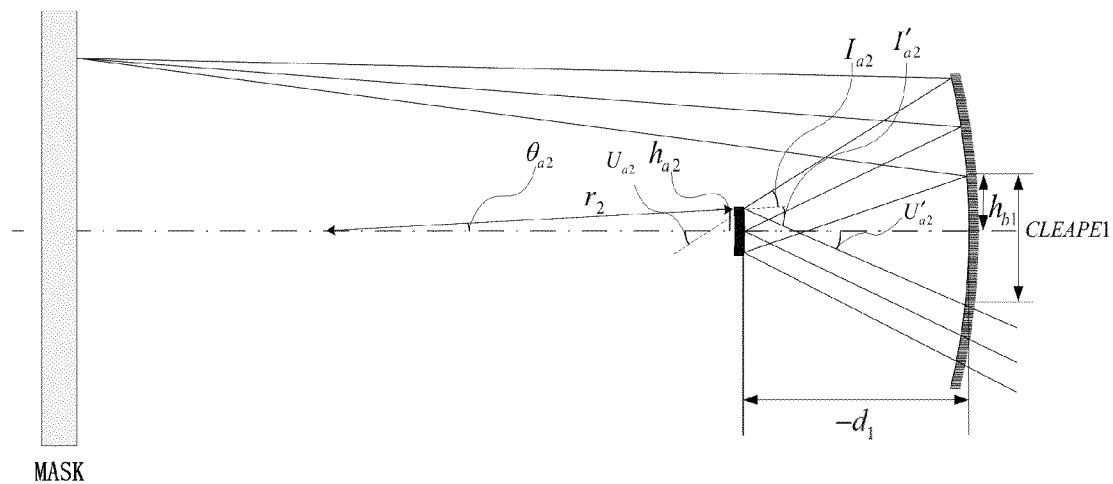
FIG. 6 is a diagram illustrating the calculation for the parameters of M2.

FIG. 5 is the diagram of CLEAPE2 versus ratio$_2$ under different ratio$_1$

STEP 106 Denote the radius of the second lens M2 as $r_2$.

With the parameters of the first lens M1 gotten through the calculations above, the radius the second lens M2 $r_2$ can be calculated. With the non-obstruction requirement of the off-axial light path of the EUVL objective, and the clear space between the lens and the light path nearby, the radius of the second lens $r_2$ can be calculated.

With the real ray trace model of the geometrical optic, there is $$\frac{h_{a2}}{r_2} = \sin\theta_{a2}$$
$$= \sin(U_{a2} - I_{a2})$$
$$= \sin\left(U_{a2} - \frac{(I_{a2} + I'_{a2})}{2}\right)$$
$$= \sin\left(\frac{U_{a2}}{2} - \frac{U'_{a2}}{2}\right)$$

-continued
$$= \sin\left(\frac{U_{a2}}{2} - \frac{\arctan\left(\frac{h_{b1} - CLEAPE1 - h_{a2}}{-d_1}\right)}{2}\right)$$

So, there is $$r_2 = h_{a2} \Big/ \sin\left(\frac{U_{a2}}{2} - \frac{\arctan\left(\frac{h_{b1} - CLEAPE1 - h_{a2}}{-d_1}\right)}{2}\right)$$

Wherein the $\theta_{a2}$ denotes the slope angle of the normal of the intersection of the upper marginal ray RAY2 and the second lens M2; the $h_{a2}$ denotes the height of the upper marginal ray RAY2 on the second lens M2; the $h_{b1}$ denotes the height of the lower marginal ray RAY3 on the first lens M1; the $I_{a2}$ denotes the incidental angle of the upper marginal ray on the second surface M2; the $I'_{a2}$ denotes the reflective angle of the upper marginal ray on the second surface M2; the $U_{a2}$ denotes the slope angle of the upper marginal ray RAY2 on the first lens M1; and the $U'_{a2}$ denotes the slope angle of the upper marginal ray RAY2 emerged from the first lens M1.

Figure 7:
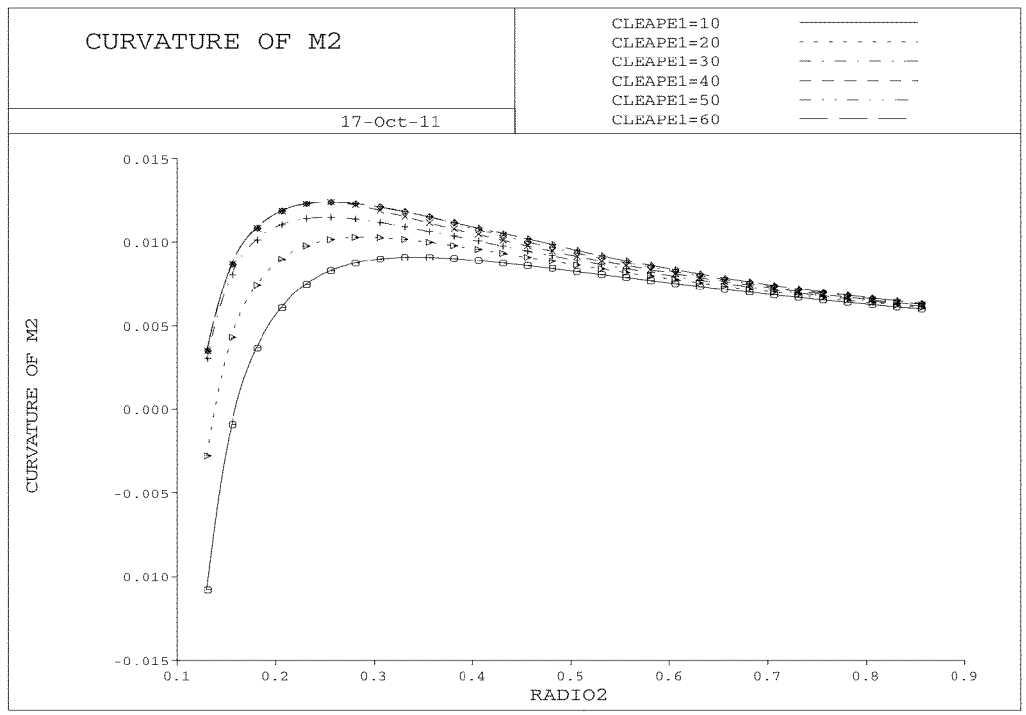
FIG. 7 is a diagram illustrating the ratio$_2$-dependent profile of the curvature of M2 1/r$_2$ under different CLEAPE2.

FIG. 7 is the diagram of $1/r_2$ versus ratio$_2$ under different CLEAPE1

Figure 8:
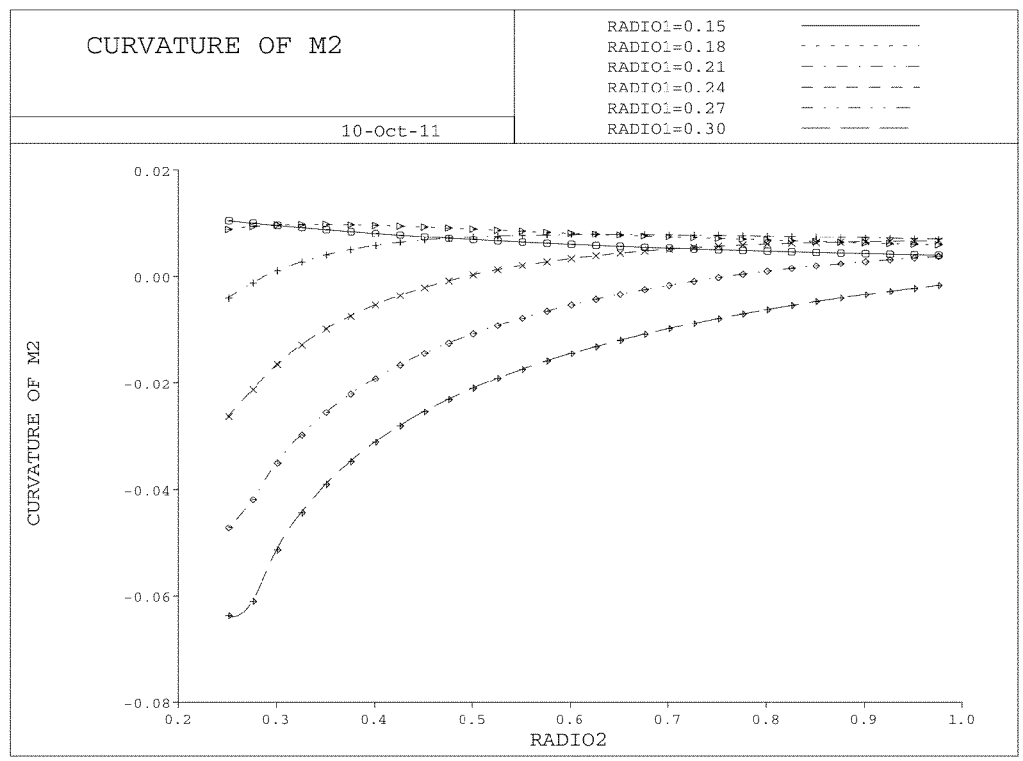
FIG. 8 is a diagram illustrating the ratio$_2$-dependent profile of the curvature of M2 1/r$_2$ under different ratio$_1$.
Figure 9:
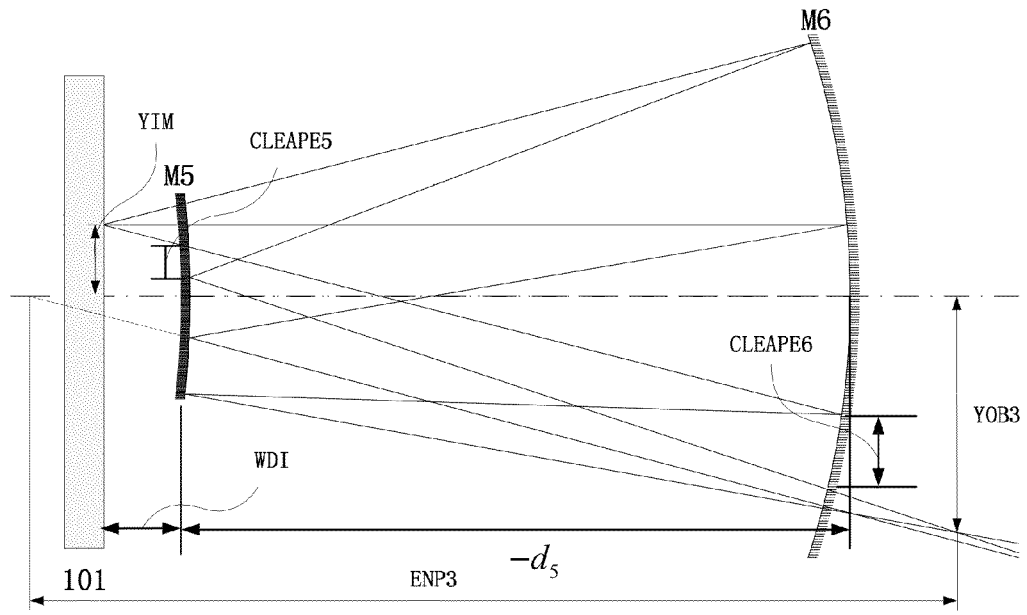
FIG. 9 is a schematic diagram of the reversal light path of G3.

FIG. 8 is the diagram of $1/r_2$ versus ratio$_2$ under different ratio$_1$.

When the $-l_1$, $-d_1$, $r_1$ and $r_2$ are gotten, the real image height YIM1, the real entrance pupil ENP1, and the real entrance pupil diameter EXD1 of the first lens group can be calculated. The calculation process is an existing technology and will not be shown here in detail.

STEP 107 Set the separation between the fifth lens M5 and the sixth lens M6 as $d_5$, then there is $|d_5|=$WDI·ratio$_3$.

Figure 10:
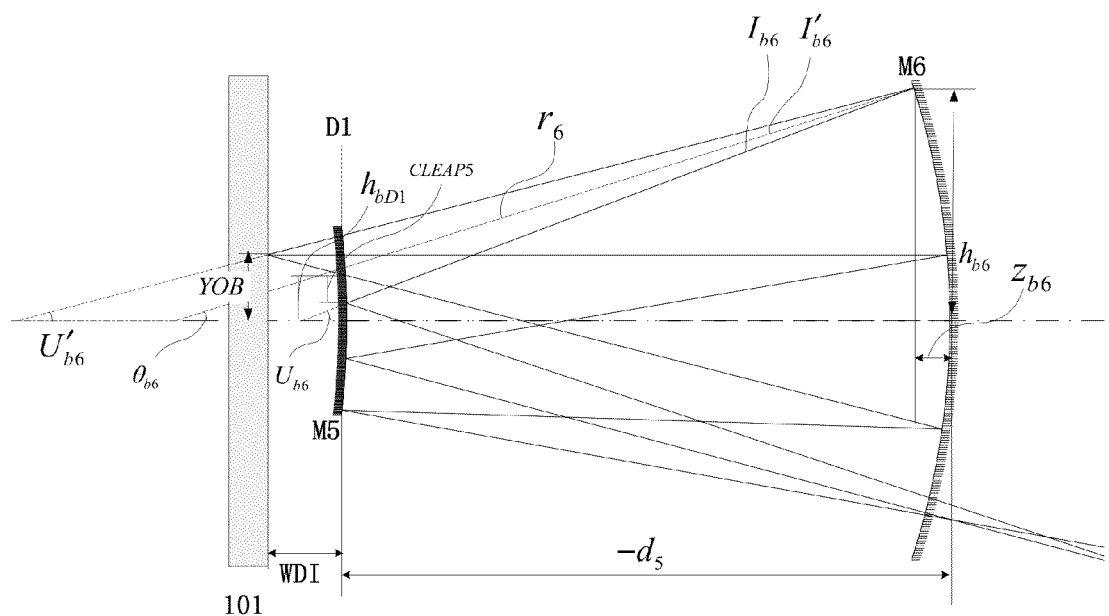
FIG. 10 is a diagram illustrating the calculation for the parameters of M6.

The third lens group G3 is near the image side (wafer side) of the objective. In actual design process, it takes a reversal light path layout for design of G3. As shown in FIG. 10, the light path in G3 is a reverse path referred to the direction of the EUVL objective light path. To avoid confusion, the parameters in G3 will still take the rule of definition in forward direction light path.

Get the image numerical aperture NAI, since it's already known that

NAO=NAI·|M|

Get the image field height YIM, since it's already known that

YOB=YIM/|M|

Get the separation between the fifth lens M5 and the sixth lens M6 $d_5$ $|d_5|=$WDI·ratio$_3$ STEP 108 Setting a dummy surface D1 in the light path, the dummy surface D1 is at the exactly same position as the position of fifth lens M5. Make the chief ray on the sixth lens M6 parallel to the optical axial OA and denote the radius of the sixth lens M6 as $r_6$.

In the reversal light path, the dummy surface is set between the wafer 102 and the sixth lens M6, in front of the sixth lens M6. Then the radius of the sixth lens M6 $r_6$ under different positions can be calculated, with the non-obstruction condition of the fifth lens M5 and the incidental ray beam on the wafer 102, the condition of teleconcentricity on the image plane, and the $r_6$ determined by ratio$_3$. As shown in FIG. 10.

$$h_{b6}/r_6 = \sin\theta_{b6}$$
$$= \sin(U_{b6} - I_{b6})$$
$$= \sin\left(U_{b6} - \frac{(I_{b6} + I'_{b6})}{2}\right)$$
$$= \sin\left(\frac{U_{b6}}{2} + \frac{U'_{b6}}{2}\right)$$
$$= \sin\left(\frac{\arctan((h_{b6} - (h_{bD1} - CLEAPE5))/(-d_5 - z_{b6}))}{3} + \frac{U'_{b6}}{2}\right)$$

So, there is $$r_6 = h_{b6} \bigg/ \sin\left(\frac{\arctan((h_{b6} - (h_{bD1} - CLEAPE5))/(-d_5 - z_{b6}))}{2} + \frac{U'_{b6}}{2}\right)$$

herein the $\theta_{b6}$ denotes the slope angle of the lower marginal ray RAY3 on the sixth lens M6, the $h_{b6}$ denotes the height of the lower marginally RAY3 on the sixth lens M6, the $h_{6D1}$ denotes the height of the lower marginal ray RAY3 on the dummy surface D1, the $I_{b6}$ denotes the incidental angle of the lower marginal ray RAY3 on the sixth lens M6, the $I'_{b6}$ denotes the reflective angle of the lower marginal ray RAY3 on the sixth lens M6, and the $z_{b6}$ denotes the axial distance between intersection of the upper marginal ray to the vertex of the sixth lens M6.

Figure 11:
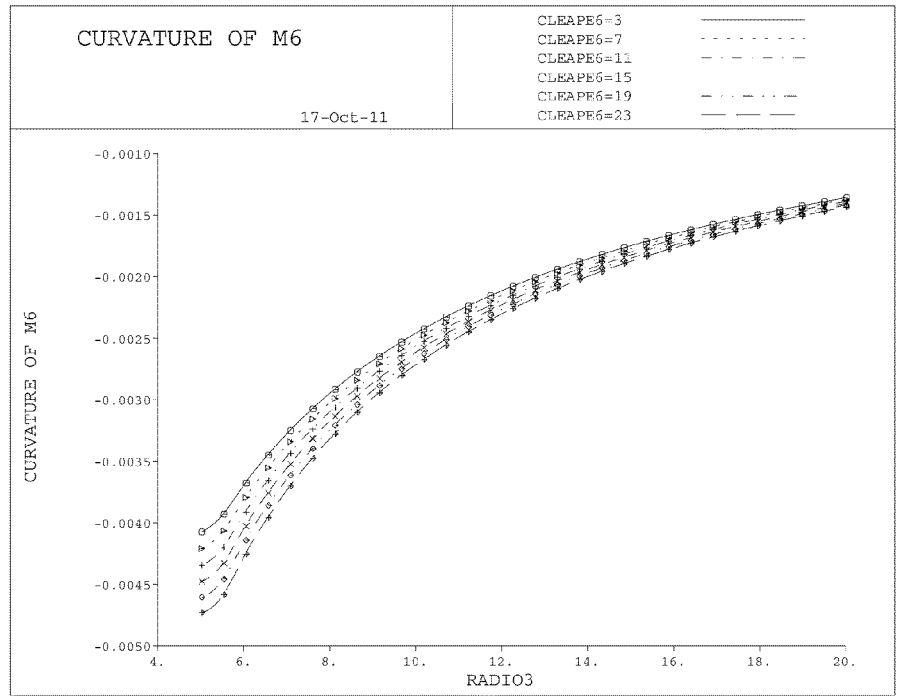
FIG. 11 is a diagram illustrating the ratio$_3$-dependent profile of the curvature of M6 1/r$_6$ under different CLEAPE6.

FIG. 11 is the diagram of $1/r_6$ versus $ratio_3$ under different CLEAPE5

Figure 12:
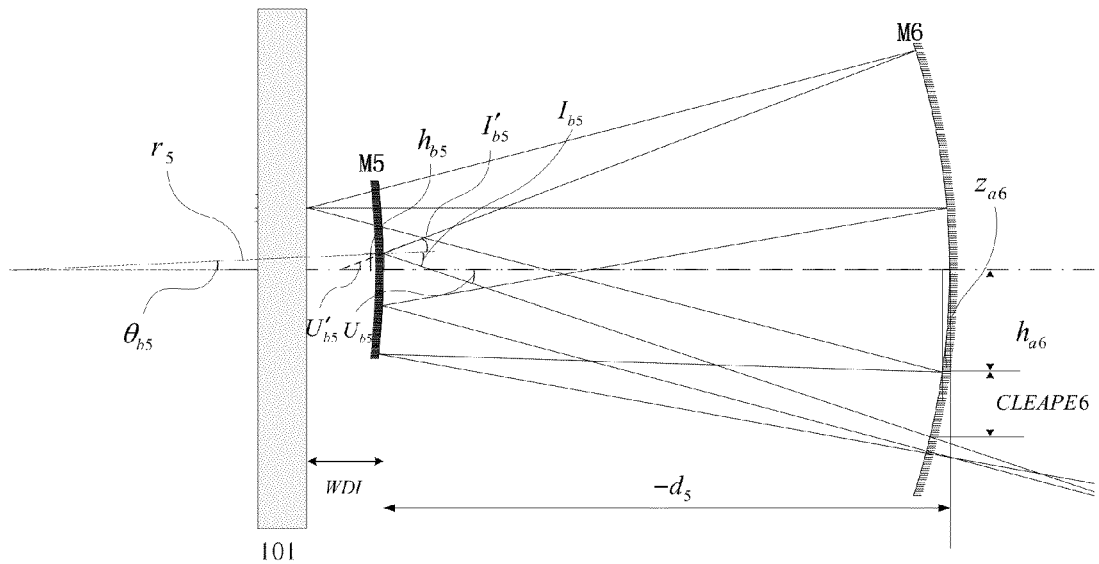
FIG. 12 is a diagram illustrating the calculation for the parameters of M5.

STEP 109 Denote the radius of the fifth lens M5 as $r_5$,

As shown in FIG. 12, setting a dummy surface D2 in the light path, the dummy surface D2 is at the exactly same position as the position of sixth lens M6. But in the reversal light path, the dummy surface is set between the fifth lens M5 and the second lens group G2, right behind the fifth lens M5. The radius of the fifth lens M5 $r_5$ under different M6 positions can be calculated, with the clear space CLEAPE6 between the incidental ray beam on the fifth lens M5 and the sixth lens M6, and the calculated radius of the sixth lens M6 $r_6$.

$$h_{b5}/r_5 = \sin\theta_{b5}$$
$$= \sin(U_{b5} - I'_5)$$
$$= \sin\left(U_{b5} - \frac{(I'_{b5} + I_{b5})}{2}\right)$$
$$= \sin\left(\frac{U_{b5}}{2} + \frac{U'_{b5}}{2}\right)$$
$$= \sin\left(\frac{\arctan((h_{b5} - (h_{a6} - CLEAPE6))/(-d_5 - z_{a6}))}{2} + \frac{U'_{b5}}{2}\right)$$

Then, there is $$r_5 = h_{b5} \bigg/ \sin\left(\frac{\arctan((h_{b5} - (h_{a6} - CLEAPE6))/(-d_5 - z_{a6}))}{2} + \frac{U'_{b5}}{2}\right)$$

Wherein the $h_{b5}$ denotes the height of lower marginal ray RAY3 on the fifth lens M5, the $h_{a6}$ denotes the height of lower marginal ray RAY3 on the sixth lens M6, the $U'_{b5}$ denotes the slope angle of the lower marginal ray RAY3 on the fifth lens M5, the $z_{a6}$ denotes the axial distance between the incidental point of the upper marginal ray RAY2 on the sixth lens M6 and the vertex of the sixth lens M6, and the $I'_{b5}$ denotes the slope angle of the lower marginal ray RAY3 on the fifth lens M5.

Figure 13:
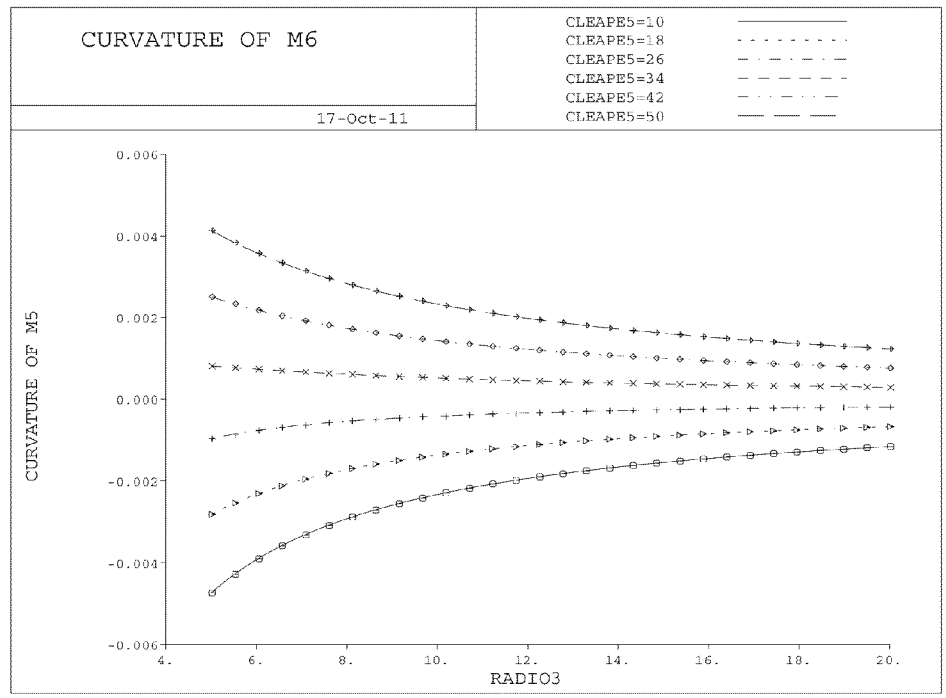
FIG. 13 is a diagram illustrating the ratio$_3$-dependent profile of the curvature of M5 1/r$_5$ under different CLEAPE5.

FIG. 13 is the diagram of $1/r_5$ versus $ratio_3$ under different CLEAPE6.

When the $d_5$, $r_6$, $r_5$, and WDI are gotten, the real object height YOB3, and the real entrance pupil ENP3 can be calculated. The calculation process is an existing technology and will not be shown here in detail.

STEP 110 Setting the radius of the third lens M3 as $r_3$, according to the object-image conjugation relationship, the magnification relationship, the pezval sum condition, the conjugation relationship of the entrance and exit pupil and the radii of the first lens M1, the second lens M2, the fifth lens M5, the sixth lens M6, and the separations between them, the radius of the fourth lens M4 denoted as $r_4$, the separation between the third lens M3 and the fourth lens M4 denoted as $d_3$, the separation between the second lens M2 and the third lens M3 denoted as $l_3$, and the separation between the fourth lens M4 and the fifth lens M5 denoted as $d_5$ (exactly the image distance of the fourth lens M4 denoted as $l'_4$) can be calculated through the paraxial iterative algorithm.

Figure 14:
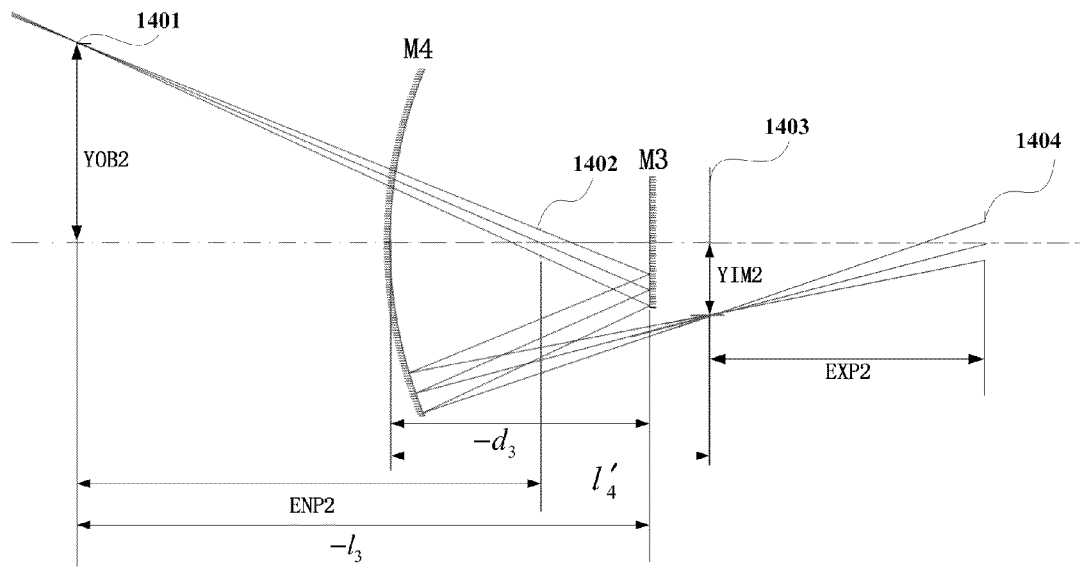
FIG. 14 is a schematic diagram of the light path of G2.

The detailed description of this step is as follow:

Referring to FIG. 14, by taking the second lens group G2 as an individual optical system, the unknown parameters of G2 include optical characteristics and the optical structure parameters. The optical characteristics include the entrance pupil diameter of the second lens group END2, the entrance pupil distance of the second lens groups ENP2 (i.e. the distance between the real object plane 1401 of the second lens group G2 and the entrance pupil 1402 of the second lens group G2), and the object field height YOB2 of the second lens group G2. The optical structure parameters include the distance between the real object plane 1401 and the third lens M3 ($l_3$), the separation between the third lens M3 and the fourth lens M4 ($d_3$), the distance between the fourth lens M4 and the image plane IM2 ($l'_4$), the radius of the third lens M3 ($r_3$), and the radius of the fourth lens M4 ($r_4$).

Since the parameters of the first lens group G1 have been chosen, the exit pupil diameter EXD1 should be equal to the entrance pupil diameter END2, i.e. making END2=EXD1;

The real image height of the first lens group YIM1 should be equal to the real object height of the second lens group YOB2, i.e. making YOB2=YIM1;

The exit pupil distance of the first lens group EXP1 should be equal to the entrance pupil distance of the second lens group ENP2, i.e. making ENP2=EXP1;

Since the parameters of the second lens group G2 have been chosen, the entrance pupil diameter ENP3 should be equal to the entrance pupil diameter EXP2, i.e. making EXP2=ENP3;

The real object height of the third lens group YOB3 should be equal to the real image height of the second lens group YIM2, i.e. making YIM2=YOB3;

With the combination of paraxial calculation and iterative calculation, the parameters of the second lens group G2 can be calculated with the parameters mentioned above.

Referring to the calculation process of the parameters of G2, four equations including object-image conjugation relationship, pupil-stop conjugation relationship, the pezval sum condition, and the magnification condition are needed for the five unknown parameters of the second group G2. With one parameter like the radius of the third lens $r_3$, the equation could give us a paraxial solution for the second lens group G2.

With the object-image conjugation relationship, there is $$\frac{1}{l_3} + \frac{1}{l'_3} = \frac{2}{r_3}$$

$$l_4 - l'_3 = -d_3$$

$$\frac{1}{l_4} + \frac{1}{l'_4} = \frac{2}{r_4}$$

Wherein, the $l_3$ denotes the object distance of the third lens M3; the $l'_3$ denotes the image distance of the third lens M3; the $d_3$ denotes the separation between the third lens M3 and the fourth lens M4; the $l_4$ denotes the object distance of the fourth lens M4, the $l'_4$ denotes the image distance of the fourth lens M4.

With the magnification relationship, there is $$\frac{l'_4}{l_4} \cdot \frac{l'_3}{l_3} = \beta$$

Wherein the $\beta$ denotes the paraxial magnification of the second lens group G2, making $\beta = M$ With the pezval sum condition, there is $$pizsum_2 = -\left(\frac{1}{r_1} - \frac{1}{r_2} + \frac{1}{r_5} - \frac{1}{r_6}\right)$$

Then $$\frac{1}{r_3} - \frac{1}{r_4} = pizsum_2$$

With the pupil-stop conjugation relationship, there is $$\frac{1}{(l_3 - enp_2)} + \frac{1}{l'_{p3}} = \frac{2}{r_3}$$

$$l_{p4} - l'_{p3} = -d$$

$$\frac{1}{l_{p4}} + \frac{1}{l'_4 + exp_2} = \frac{2}{r_4}$$

Wherein, the $enp_2$ denotes the paraxial entrance pupil distance of the second lens group G2; the $enp_2$ denotes the exit pupil distance of the first lens groups G1; the $l'_{p3}$ denotes the paraxial image distance of the entrance pupil of the second lens group G2 with the third lens M3; the $l_{p4}$ denotes the paraxial object distance of the entrance pupil of the second lens group G2 with the fourth lens M4; the $exp_2$ denotes the exit pupil distance of the second lens group G2, i.e. the entrance pupil distance of the third lens G3.

The solutions are as follow:

$$d_3 = \frac{1}{4} \cdot \frac{r_3^2 \cdot (2 \cdot enp_2 \cdot \beta \cdot exp_2 \cdot pizsum_2 - exp_2 + enp_2 \cdot \beta^2)}{\beta \cdot enp_2 \cdot exp_2 \cdot (1 + pizsum_2 \cdot r_3)}$$

$$l_3 = \frac{1}{2} \cdot \frac{2 \cdot enp_2 \cdot \beta \cdot exp_2 \cdot pizsum_2 \cdot r_3 - r_3 \cdot exp_2 + r_3 \cdot enp_2 \cdot \beta^2 + 2 \cdot enp_2 \cdot \beta \cdot exp + 2 \cdot enp_2 \cdot \beta \cdot exp_2}{-exp_2 + enp_2 \cdot \beta^2}$$

$$l'_3 = \frac{1}{4} \cdot \frac{\begin{pmatrix} 2 \cdot enp_2 \cdot \beta \cdot exp_2 \cdot pizsum_2 \cdot r_3 - r_3 \cdot \\ exp_2 + r_3 \cdot enp_2 \cdot \beta^2 + 2 \cdot enp_2 \cdot \\ exp_2 + 2 \cdot enp_2 \cdot \beta \cdot exp_2 \end{pmatrix} \cdot r_3}{(\beta \cdot r_3 \cdot pizsum_2 + 1 + \beta) \cdot enp_2 \cdot exp_2}$$

$$l_4 = \frac{1}{4} \cdot \frac{\begin{pmatrix} r_3 \cdot exp_2 + 2 \cdot enp_2 \cdot \beta \cdot exp_2 - r_4 \cdot enp_2 \cdot \beta^2 + \\ 2\beta^2 \cdot exp_2 \cdot enp_2 + 2\beta^2 \cdot exp_2 \cdot enp_2 \cdot pizsum_2 \end{pmatrix} \cdot r_3}{enp_2 \cdot \beta \cdot exp_2 \cdot \begin{pmatrix} 1 + \beta + 2\beta \cdot r_3 \cdot pizsum_2 + \\ pizsum_2 \cdot r_3 + pizsum_2^2 \cdot r_3^2 \cdot \beta \end{pmatrix}}$$

$$l'_4 = -\frac{1}{2} \cdot \frac{r_3 \cdot exp_2 + 2 \cdot enp_2 \cdot \beta^2 - r_3 \cdot enp_2 \cdot \beta^2 + 2\beta^2 \cdot enp_2 \cdot exp_2 + 2 \cdot \beta^2 \cdot r_3 \cdot enp_2 \cdot exp_2 \cdot pizsum_2}{enp_2 \cdot \beta^2 - exp_2 - exp_2 \cdot pizsum_2 \cdot r_3 + r_3 \cdot \beta^2 \cdot pizsum_2 \cdot enp_2}$$

$$l'_{p3} = \frac{1}{4} \cdot \frac{\begin{pmatrix} 2 \cdot enp_2 \cdot \beta \cdot exp_2 \cdot pizsum_2 \cdot r_3 - r_3 \cdot exp_2 + r_3 \cdot exp_2 \cdot \\ \beta^2 + 2 \cdot enp_2 \cdot \beta \cdot exp_2 + 2enp_2^2 \cdot \beta^2 \end{pmatrix}}{(exp_2 \cdot pizsum_2 \cdot r_3 + exp_2 + enp_2 \cdot \beta) \cdot enp_2 \cdot \beta}$$

$$l_{p4} = -\frac{1}{4} \cdot \frac{\begin{pmatrix} -2 \cdot exp_2^2 \cdot pizsum_2 \cdot r_3 - r_3 \cdot exp_2 - 2 \cdot enp_2 \cdot \beta \cdot \\ exp_2 - 2 \cdot exp_2^2 + r_3 \cdot enp_2 \cdot \beta^2 \end{pmatrix}}{\begin{pmatrix} 2 \cdot exp_2 \cdot pizsum_2 \cdot enp_2 + pizsum_2^2 \cdot r_3^2 \cdot exp_2 + \\ enp_2 \cdot \beta + enp_2 \cdot \beta \cdot pizsum_2 \cdot r_3 + exp_2 \end{pmatrix}}$$

$$r_4 = r_3 / (1 + pizsum_2 \cdot r_3)$$

Then the radius of the fourth lens $r_4$, the separation between the third lens and the fourth lens $d_3$, the object distance of the third lens $l_3$, and the image distance of the fourth lens $l'_4$ can be obtained.

STEP 111 From the radii and their position relationships of the six lenses calculated from the steps mentioned above, the whole design of the EUVL projection objective can be obtained.

The above mentioned $r_3$ is an artificially chosen value. Because the input parameters are all paraxial values, the values got from the equations do not fit the demands of the non-paraxial parameters. However, with the trend of the variation of the paraxial parameters, we can judge whether a reasonable G2 is exist or not under the combination of the current G1 and G3, and then get an available range of $r_3$.

The invention takes the second lens group G2 as an individual optical system, by taking the paraxial magnification of G2 as $\beta = M$, making the paraxial entrance pupil distance of the second lens $enp_2$ equal to the exit pupil distance of the first lens group, i.e. $enp_2 = ENP1$; making the paraxial exit pupil distance of the second lens group $exp_2$ equal to the entrance pupil distance of the G3, i.e. $exp_2 = EXP3$; 1500 mm$>(-l_3 - enp_2)>0$ and $0>d_3>1500$ mm as constraint conditions, the available range of radius of the third lens $r_3$ can be decided with the conjugation relationship of object and image, the magnification condition, the pezval sum condition, and the conjugation relationship of the entrance and exit pupil. Then, the radius of the third lens $r_3$ can be picked up from that available range.

Here is the description of the chosen range of the $r_3$ with examples.

The input parameters are shown in table 1.

TABLE 1

| | |
|---|---|
| 1/$r_3$ | −0.002~0.002 |
| Entrance pupil distance ENP2 | −1883.508480 |
| Exit pupil distance EXP2 | 352.613104 |
| Pezval sum pizsum$_2$ | −0.000811 |
| Magnification M | −0.496181 |
| Entrance pupil diameter END2 | 143.574801 |
| Object file height YOB2 | −174.424131 | make
enp$_2$ = ENP1
exp$_2$ = EXP3
β = M

Different parameters versus 1/$r_3$ are shown in FIG. 15(a)~(d). For an available EUVL projection objective, the total track should be controlled in a reasonable range. In this embodiment, the total track is constrained below 2000 mm; the third lens M3 should be set behind the second lens M2; the fourth lens M4 should be set in front of the third lens M3; and all the intervals should be shorter than the total track, leading to 1500 mm>(−$l_3$−enp$_2$)>0 and 0>$d_3$>1500 mm.

Figure 15:
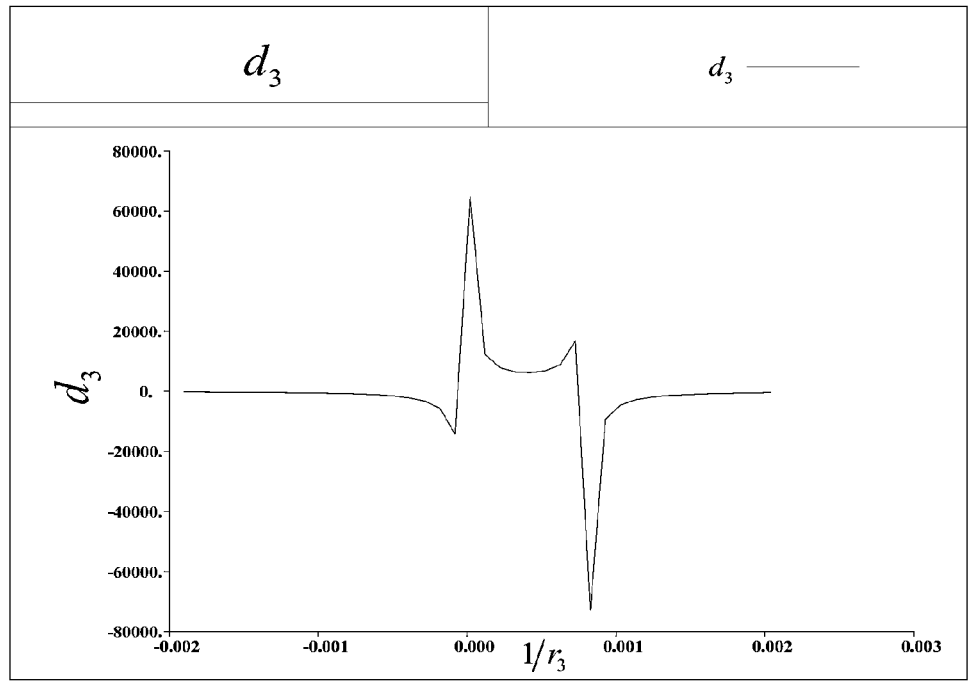
FIG. 15(a) is a diagram illustrating the r$_3$-dependent profile of the parameter d$_3$ in G2.
FIG. 15(b) is a diagram illustrating the r$_3$-dependent profile of the parameter $-l_3$-ENP$_2$ in G2.
FIG. 15(c) is a diagram illustrating the r$_3$-dependent profile of the parameter l'$_4$ in G2.
FIG. 15(d) is a diagram illustrating the r$_3$-dependent profile of the parameter r$_4$ in G2.
Figure 15:
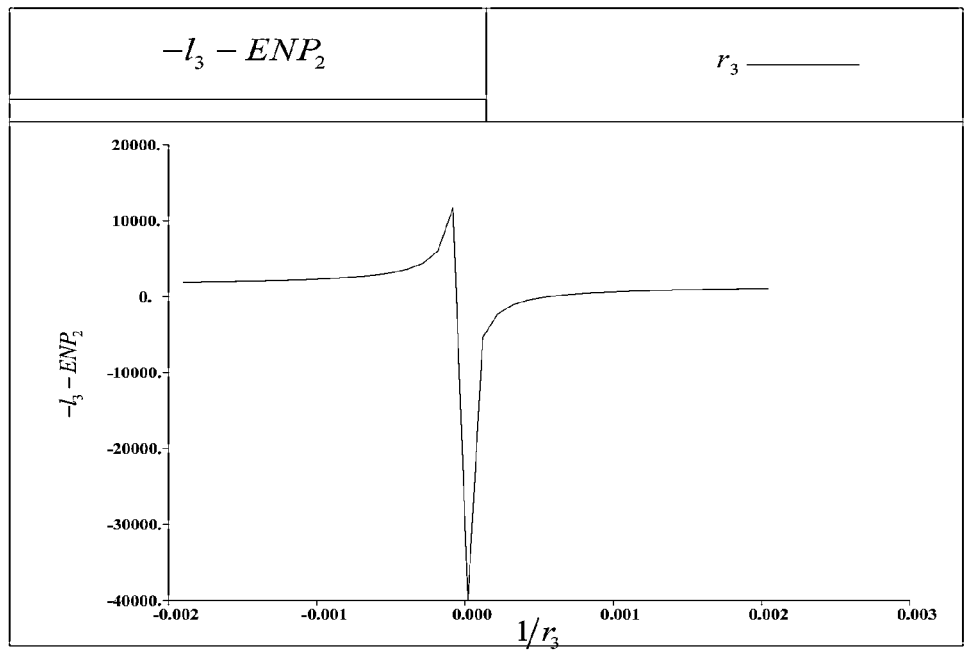
Figure 15:
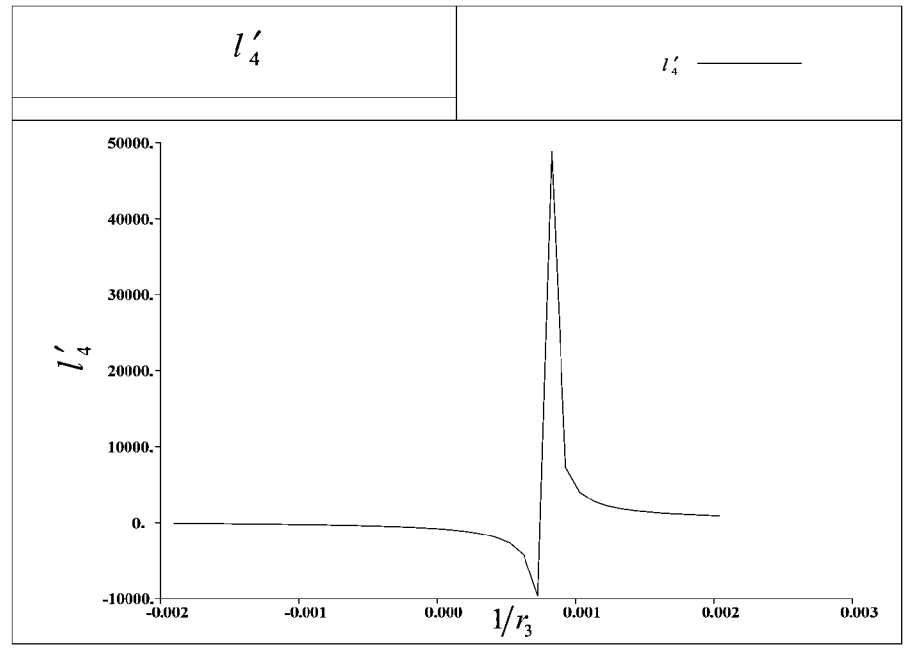
Figure 15:
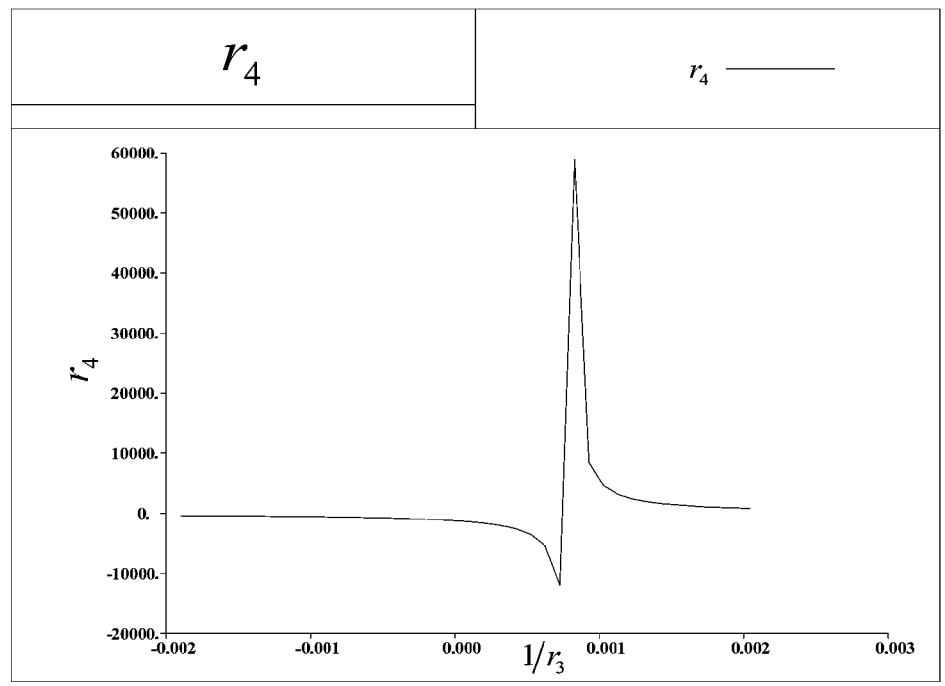
Figure 16:
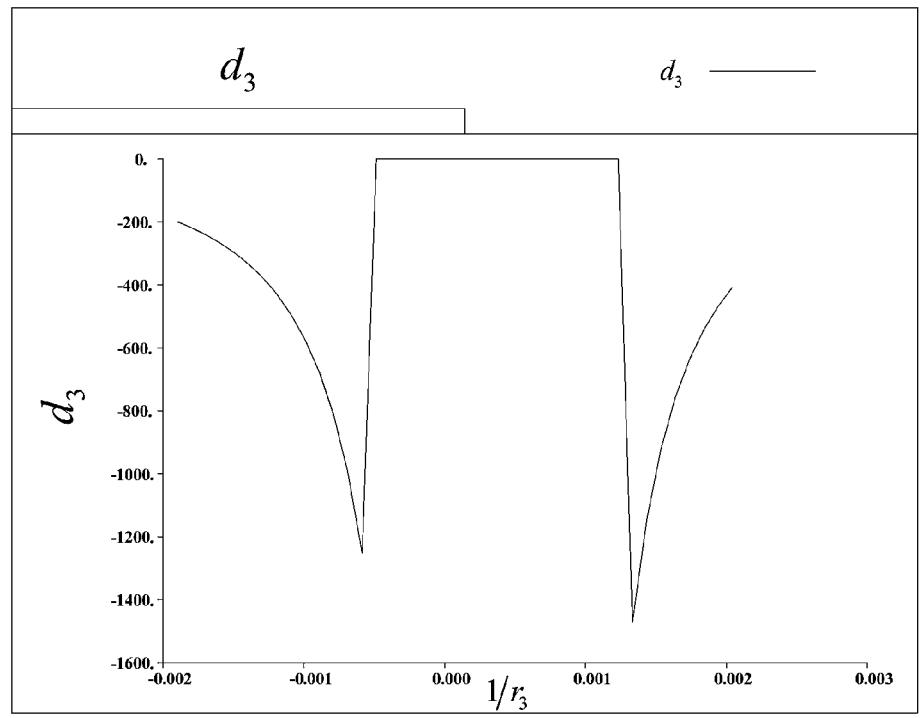
FIG. 16(a) is a diagram illustrating the sifting situation of the parameter d$_3$ in G2.
FIG. 16(b) is a diagram illustrating the sifting situation of the parameter $-l_3$-ENP$_2$ in G2.
Figure 16:
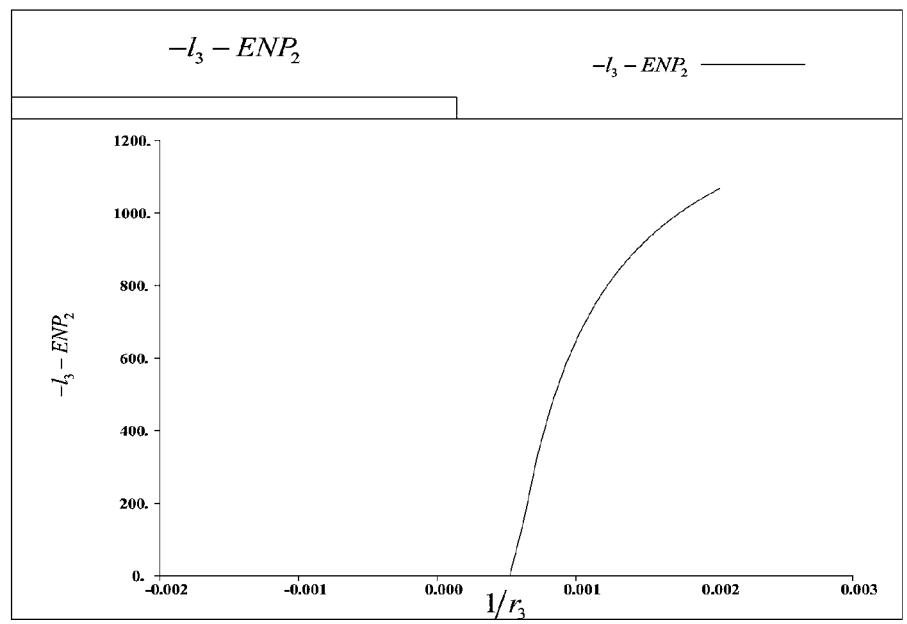

For convenience, we set the object distance and the interval in FIG. 15(a) and FIG. 15(b) out of the available range to zero. Then the FIG. 15(a) and FIG. 15(b) are converted to FIG. 16(a) and FIG. 16(b), making the available range of $r_3$ clear. By comparing and analyzing FIG. 16(a) and FIG. 16(b), we can know whether there is available solution for the second lens group G2 or not.

For the paraxial magnification β and the real magnification M of the second lens group G2 are different, the paraxial exit pupil distance exp$_2$ and the real exit pupil distance EXP$_2$ of the second lens group G2 are different either, the solved parameters from the steps above cannot be taken as the result of G2 immediately.

Actually, for any off-axial optical system with two lenses, the real and paraxial parameters cannot be exactly the same.

For an off-axial optical system with two spherical lenses, there must be a set of paraxial parameters for it when its real characteristics match the needs. We can get it by the iteration and approach method. The detailed steps are as follow:

The following steps are for further optimization for the parameters of the second lens group:

STEP 201 Choose a radius of the third lens $r_3$, set the error factor $\xi_\beta$ and $\xi_{exp_2}$, and take β(1)=M and exp$_2$(1)=EXP1, set the loop time k=1.

STEP 202 Through the parameters β(k), exp$_2$(k), and the chosen $r_3$, with the conjugation relationship of the object and the image, the magnification, the pezval sum condition, and the conjugation relationship of the entrance and exit pupil, get the parameters $d_3$(k), $l_3$(k), $l'_4$(k), and $r_4$(k) of the second lens group G2.

STEP 203 Put the $r_3$, $d_3$(k), $l_3$(k), $l'_4$(k), and $r_4$(k) into the optical design software CODEV, and obtain the magnification M(k) and the real exit pupil distance EXP2(k) of the second lens group G2.

STEP 204 If |EXP2(k)−EXP1|≤$\xi_{exp_2}$ and |M(k)−M|≤$\xi_\beta$, end the optimization process, and take the current $r_3$, $d_3$(k), $l'_3$(k), $l'_4$(k), and $r_4$(k) as the parameters of the second lens group G2, if not, go to the step 205.

STEP 205 Take β(k+1)=β(k)·[M/M(k)]$^\sigma$, exp$_2$(k+1)=exp$_2$(k)·[EXP1/EXP2(k)]$^\sigma$, wherein the σ≤1, making k=k+1, and go back to STEP 202.

In this invention, there is $$\sigma \in \left\{\frac{1}{4}, \frac{1}{2}, 1\right\},$$

wherein the [M/M(k)]$^\sigma$ and [EXP1/EXP2(k)]$^\sigma$ are called approach factors. When the solution space of the second lens group is small, and the [M/M(k)]$^1$ and [EXP1/EXP2(k)]$^1$ (σ=1) deal the paraxial magnification and the exit pupil distance with the above approach factors, the solution may get out of the reasonable range and make the results far from convergent. So we can take $$\sigma = \frac{1}{2},$$

i.e. with the approach factors of [M/M(k)]$^{1/2}$ and [EXP1/EXP2(k)]$^{1/2}$, or $$\sigma = \frac{1}{4},$$

i.e. with the approach factors of [M/M(k)]$^{1/4}$ and [EXP1/EXP2(k)]$^{1/4}$ to make the searching process stable, although the later one may get too many iteration times. So $$\sigma = \frac{1}{2}$$

is the most suitable and well applied factor.

Figure 17:
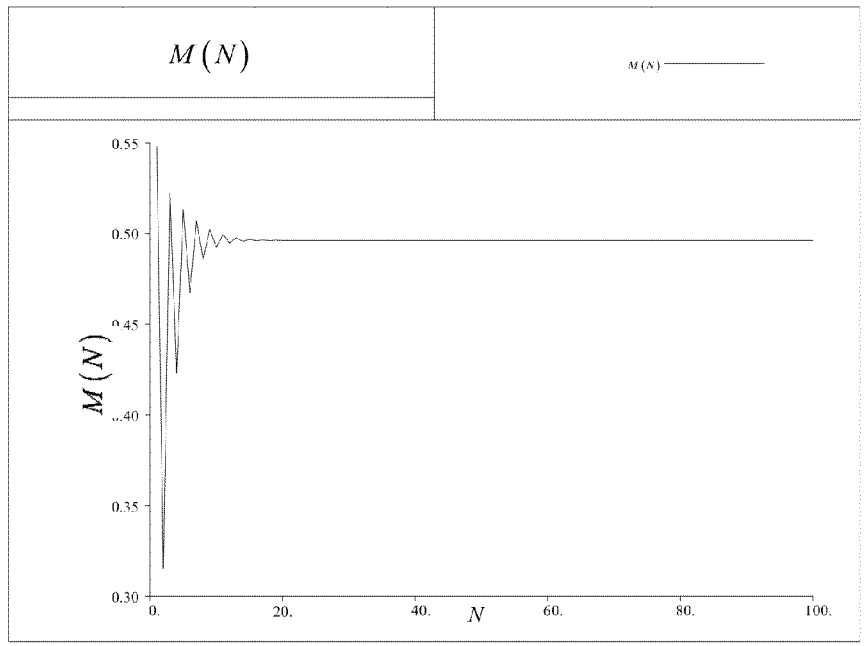
FIG. 17 is a diagram illustrating the convergence situation of the magnification of G2 when iteration time goes up.

FIG. 17 is the convergence situation of the G2's magnification M versus the iteration times.

EMBODIMENT 1

Figure 18:
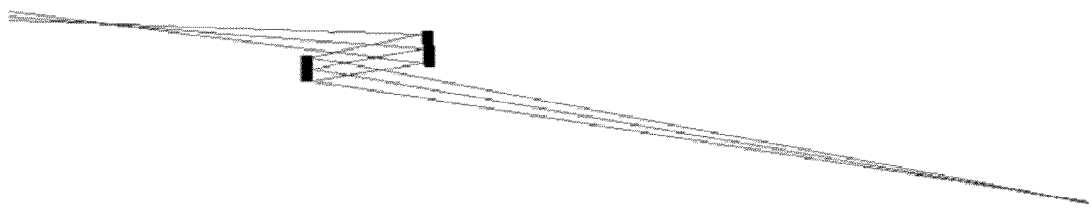
FIG. 18(a) is a schematic diagram of the light path of G1 lens group in an embodiment.
FIG. 18(b) is a schematic diagram of the light path of G3 lens group in an embodiment.
FIG. 18(c) is a schematic diagram of three layouts of G2 which are used to connect the layout of G1 in FIG. 18(a) and the layout of G3 in FIG. 18(b)
FIG. 18(d) is a schematic diagram of three embodiments of the EUVL projection objective.
Figure 18:
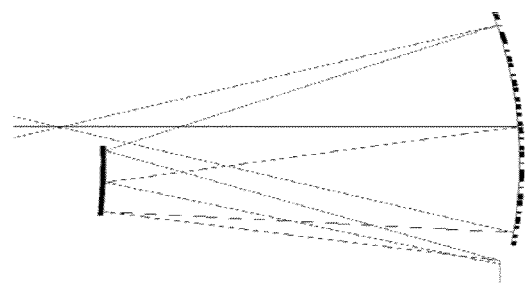
Figure 18:
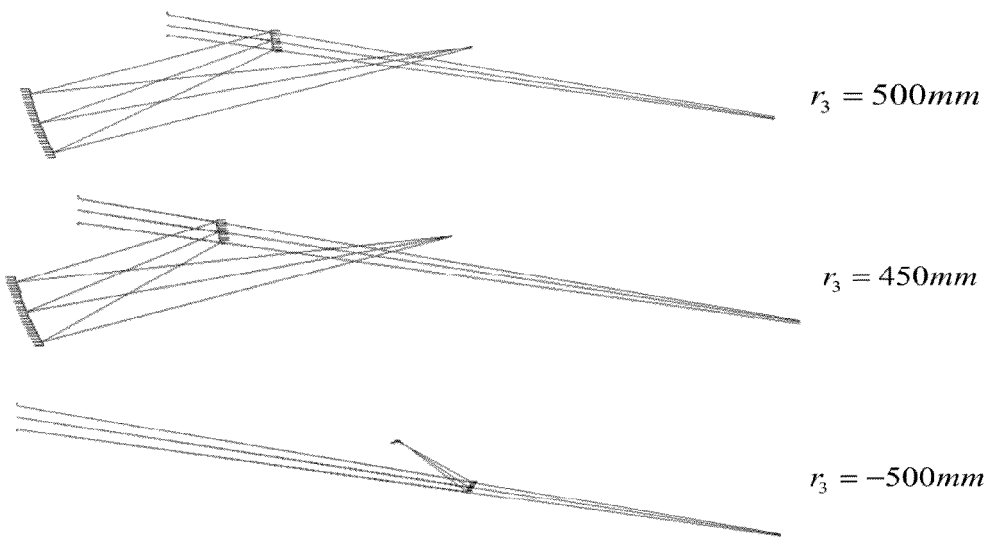
Figure 18:
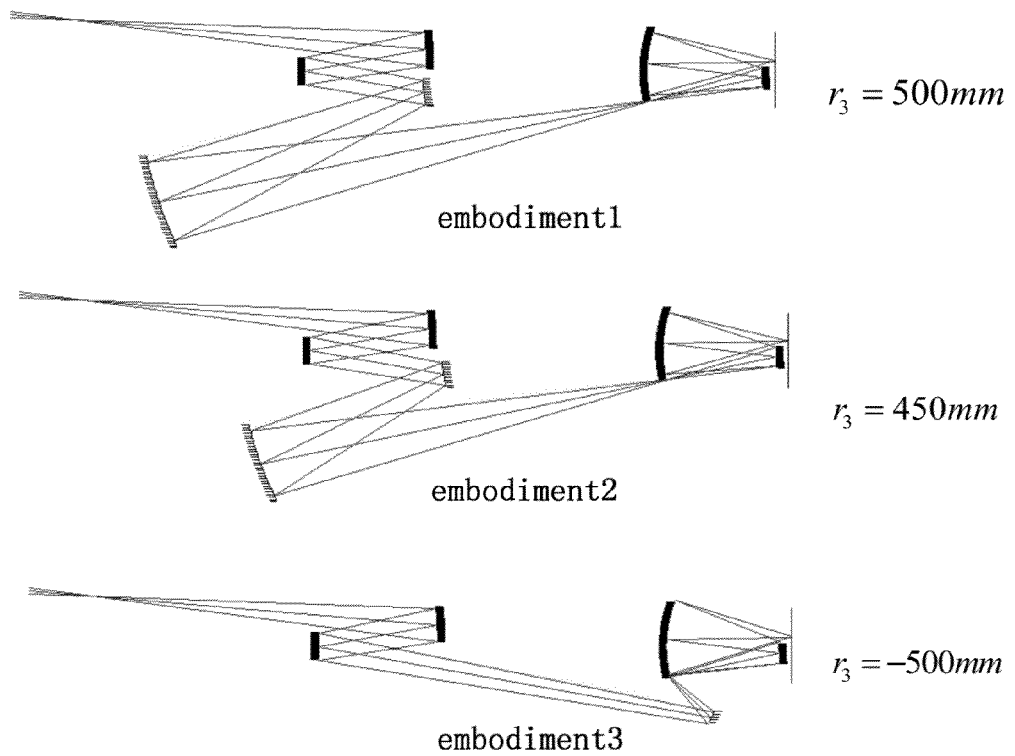

The layout of a randomly chosen structure of the first lens group G1 is shown in FIG. 18(a), the aperture diaphragm is set on the second lens M2, and the incidental angle of the chief ray on the mask is 5°. This structure is reasonably arranged with considerations of practical machining. Its optical characteristics and structural parameters are shown in table 2, wherein the $$pizsum_1 = \frac{1}{r_1} - \frac{1}{r_2}.$$

TABLE 2

| | |
|---|---|
| NAO | 0.05 |
| CA | 5.00000 |
| ratio$_1$ | 0.153 |
| ratio$_2$ | 0.352 |
| YOB | 132.5000 |
| −$l_1$ | 304.7500 |
| −$d_1$ | −304.749986 |
| $r_1$ | −1160.173602 |
| $r_2$ | −9301.878824 |
| $l'_2$ | 1970.7450 |
| YIM1 | −368.998492 |
| EXP1 | 1970.744988 |
| pizsum$_1$ | −0.000754435 |

The layout of a randomly chosen structure of the third lens group G3 is shown in FIG. 18(b). Its optical characteristics and structural parameters are shown in table 3, wherein the $$pizsum_3 = \frac{1}{r_5} - \frac{1}{r_6}.$$

TABLE 3

| | |
|---|---|
| NA1 | 0.25 |
| CA | telecentricity |
| ratio$_3$ | 9.000000 |
| YIM | 26.5000 |
| l'$_6$ | 320.0000 |
| d$_5$ | −288.0000 |
| r$_6$ | −358.854572 |
| r$_5$ | −411.048060 |
| −l$_5$ | 273.972300 |
| YOB3 | −76.985423 |
| ENP3 | 354.566741 |
| pizsum$_3$ | −0.000354 |

With the parameters of G1 and G3 obtained from the processes mentioned above, the essential parameters for the calculation of G2 can be obtained, which is shown in table 4.

TABLE 4

| | |
|---|---|
| 1/r$_3$ | −0.002~0.002 |
| Entrance pupil distance ENP2 | −1970.744988 |
| Exit pupil distance EXP2 | 354.566741 |
| Pezval sum pizsum$_2$ | −0.001108 |
| Magnification M | −0.208633 |
| Entrance pupil diameter END2 | 72.144399 |
| Object file height YOB2 | −368.998492 |

Three layouts of the structures of G2 are shown in FIG. 18(c), of which the corresponding radii of the lenses of G3 are 500 mm, 450 mm, and −500 mm.

The parameters of the three embodiments are shown in table 5, table 6 and table 7. Table 8 shows the comparison of the total track with the maximum diameter of the three embodiments, wherein there are $c_1=1/r_1$, $c_2=1/r_2$, $c_3=1/r_3$, $c_4=1/r_4$, $c_5=1/r_5$, $c_6=1/r_6$. The $d_1$ denotes the distance between the mask and the first lens M1; the $d_2$□$d_6$ denote the separation between the corresponding lens to the next lens; and the $d_7$ denotes the separation between the sixth lens M6 to the wafer.

For the first embodiment, the third lens M3 is set behind the image plane, which is not convenient for the moving of the scanner. The total track of the second embodiment is relatively small, but the maximum diameter of which is relatively large. The maximum diameter of the third embodiment is relatively small, but the total track of which relatively is large. The proper radius of the third lens M3 can be chosen according to the engineering practice.

TABLE 5

| | curvature | | Thickness |
|---|---|---|---|
| | | d$_1$ | 865.6667 |
| c$_1$ | −0.000862 | d$_2$ | −304.7500 |
| c$_2$ | −0.000108 | d$_3$ | 294.8853 |
| c$_3$ | 0.002000 | d$_4$ | −712.911491 |
| c$_4$ | 0.000892 | d$_5$ | 1562.2970 |
| c$_5$ | 0.002433 | d$_6$ | −288.000 |
| c$_6$ | 0.002787 | d$_7$ | 320.0000 |

TABLE 6

| | curvature | | Thickness |
|---|---|---|---|
| | | d$_1$ | 865.6667 |
| c$_1$ | −0.000862 | d$_2$ | −304.7500 |
| c$_2$ | −0.000108 | d$_3$ | 336.3676 |
| c$_3$ | 0.002222 | d$_4$ | −512.9432 |
| c$_4$ | 0.001114 | d$_5$ | 1363.527 |
| c$_5$ | 0.002433 | d$_6$ | −288.000 |
| c$_6$ | 0.002787 | d$_7$ | 320.0000 |

TABLE 7

| | curvature | | Thickness |
|---|---|---|---|
| | | d$_1$ | 865.6667 |
| c$_1$ | −0.000862 | d$_2$ | −304.7500 |
| c$_2$ | −0.000108 | d$_3$ | 1049.8990 |
| c$_3$ | −0.002500 | d$_4$ | −142.7610 |
| c$_4$ | −0.003608 | d$_5$ | 269.1092 |
| c$_5$ | 0.002433 | d$_6$ | −288.000 |
| c$_6$ | 0.002787 | d$_7$ | 320.0000 |

TABLE 8

| System # | Total length | Maximum diameter |
|---|---|---|
| System1 | 1737.1874 | 888.3862 |
| System2 | 1779.8679 | 771.7360 |
| System3 | 1769.1643 | 407.6502 |

Figure 19:
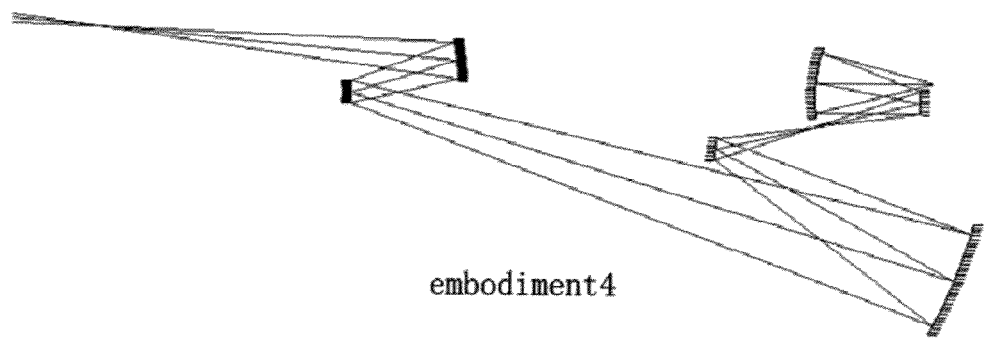
FIG. 19(a) is a schematic diagram of the fourth embodiment of the EUVL projection objective.
FIG. 19(b) is a schematic diagram of the fifth embodiment of the EUVL projection objective.
FIG. 19(c) is a schematic diagram of the sixth embodiment of the EUVL projection objective.
Figure 19:
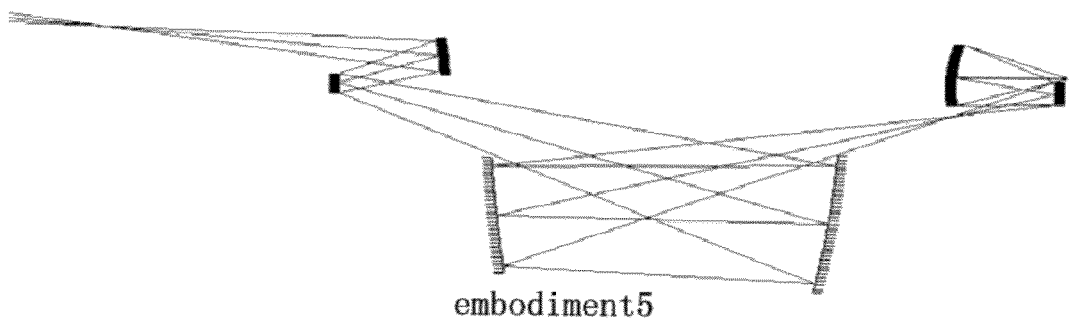
Figure 19:
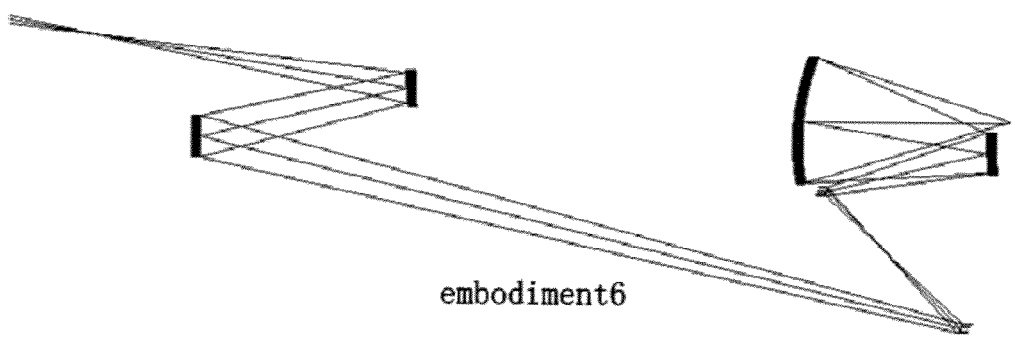

Referring to the FIG. 19(a), FIG. 19(b), FIG. 19(c), the other three embodiments obtained through grouping design method are shown, of which the detail parameters are shown in table 9, table 10 and table 11. Some of the embodiments may be unsuitable for manufacturing, and they will only be shown here as examples of the design method.

TABLE 9

| | curvature | | Thickness |
|---|---|---|---|
| | | d$_1$ | 749.5141 |
| c$_1$ | −0.001541 | d$_2$ | −224.8542 |
| c$_2$ | −0.002866 | d$_3$ | 1344.351 |
| c$_3$ | −0.001000 | d$_4$ | −570.4919 |
| c$_4$ | −0.001149 | d$_5$ | 418.7801 |
| c$_5$ | 0.001968 | d$_6$ | −222.1395 |
| c$_6$ | 0.003442 | d$_7$ | 251.7581 |

TABLE 10

| | curvature | | Thickness |
|---|---|---|---|
| | | d$_1$ | 749.5141 |
| c$_1$ | −0.0015411 | d$_2$ | −224.8542 |
| c$_2$ | −0.0038309 | d$_3$ | 1119.093 |
| c$_3$ | −0.0004762 | d$_4$ | −781.3919 |
| c$_4$ | 0.00033972 | d$_5$ | −222.1395 |
| c$_5$ | 0.00196793 | d$_6$ | 1259.953 |
| c$_6$ | 0.00344177 | d$_7$ | 251.7581 |

TABLE 11

| | curvature | | Thickness |
|---|---|---|---|
| | | d$_1$ | 407.9396 |
| c$_1$ | −0.000581 | d$_2$ | −274.6366 |
| c$_2$ | 0.000798 | d$_3$ | 1072.295 |

TABLE 11-continued

| | curvature | | Thickness |
|---|---|---|---|
| $c_3$ | −0.002000 | $d_4$ | −233.6414 |
| $c_4$ | −0.004080 | $d_5$ | 202.4978 |
| $c_5$ | 0.002501 | $d_6$ | −244.6155 |
| $c_6$ | 0.003203 | $d_7$ | 274.6155 |

Figure 20:
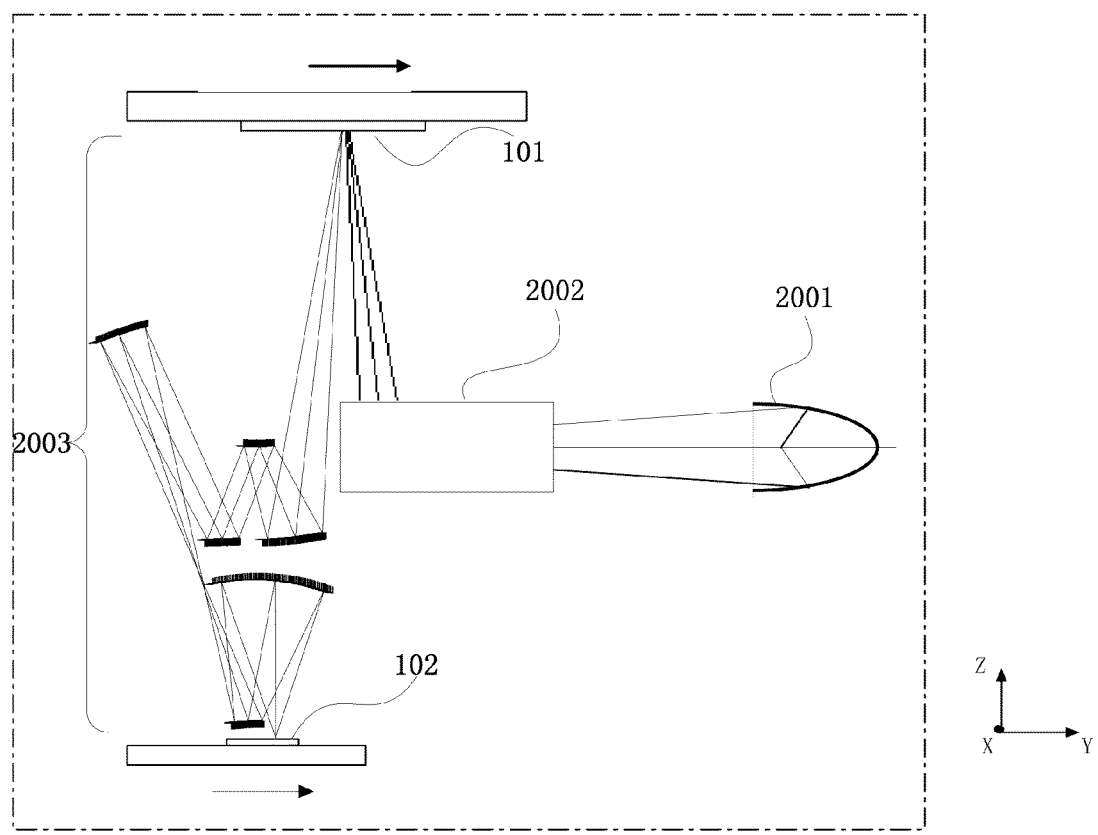
FIG. 20 is a schematic diagram of a typical EUVL projection exposure system.

FIG. 20 is a schematic diagram of a typical EUVL projection exposure system. The ray beam emerges from the source 2001, gets reshaped and uniformed by the illumination system 2002, and then incidents into the reflective mask 101. Reflected by the mask, the ray beam incidents into the projection system 2003, and then generates an image on the wafer 102 with exposure. The EUVL projection objective obtained by the design of this invention can be applied to that EUVL system. The ray beam with 13.5 nm wavelength emerged from the EUV source, passed through the illumination system, incidents into the mask, gets reflected, and then incidents into the first lens M1, the second lens M2, the third lens M3, the fourth lens M4, the fifth lens M5, and the sixth lens M6, then finally generates an image on the wafer.

Although the embodiments have been described associated with specific projection-optical systems as used in the exposure apparatus, it should be clear that this invention can also be applied to many other projection optical systems in general. And even though the invention has been described on the basis of specific embodiments, numerous variations and alternative embodiments can be deduced by the person skilled in the art, e.g. by combination and/or exchange of features of individual embodiments. Accordingly, it goes without saying for the person skilled in the art that such variations and alternative embodiments are also encompassed by the present invention, and the scope of the invention is only restricted within the meaning of the accompanying patent claims and the equivalents thereof.

What is claimed is:

1. A method of designing an extreme ultraviolet lithography projection objective, wherein the projection objective is disposed between a mask and a wafer plane, the objective comprising six lenses and an aperture diaphragm positioned from the mask along a beam propagation direction to the wafer plane in the order of: a first lens (M1), the aperture diaphragm disposed on a second lens (M2), the second lens, a third lens (M3), a fourth lens (M4), a fifth lens (M5), and a sixth lens (M6), said method comprising the steps of:

determining a set of optical parameters of the projection objective comprising: object side numerical aperture (NAO), magnification of the objective (M), image side numerical aperture (NAI), object field height (YOB), image field height (YIM); and incidental angle of chief ray on object side (CA) based on NAO;

determining a ratio of the object field height YOB to the distance between the mask and the first lens M1 (ratio$_1$), a ratio of the distance between the first lens M1 and the second lens M2 to the distance between the mask and the first lens M1 (ratio$_2$), a clear unobstructed space between the first lens M1 and the ray beam emerged from M2 (CLEAPE1), a working distance between the wafer and the sixth lens M6 (WDI), a ratio of WDI to the distance between the fifth lens M5 and the sixth lens M6 (ratio$_3$), a clear unobstructed space between the sixth lens M6 and an incidental ray beam onto the fifth lens M5 (CLEAPE6), and a clear obstructed space between the fifth lens M5 and an emerged ray beam from M6 (CLEAPE5);

determining a distance between the mask and the first lens M1 as $-l_1$, wherein $|-l_1|=$YOB/ratio$_1$, and determining a distance between the first lens M1 and the second lens M2 as $-d_1$, wherein $|-d_1|=$YOB/ratio$_1\cdot$ratio$_2$;

determining the radius of the first lens M1 as $r_1$, wherein $$r_1 = h_{z1} \Big/ \sin\left(\frac{\arctan(h_{z1}/(-d_1+z_{z1}))}{2} - \frac{CA}{2}\right)$$

where $h_{z1}$ denotes the height of chief ray (RAY1) on the first lens M1, and $z_{z1}$ denotes the axial distance of an incidental point of chief ray RAY1 on the first lens M1 to the vertex of the first lens M1;

determining the radius of the second lens M2 as $r_2$, wherein $$r_2 = h_{a2} \Big/ \sin\left(\frac{U_{a2}}{2} - \frac{\arctan\left(\frac{h_{b1}-CLEAPE1-h_{a2}}{-d_1}\right)}{2}\right)$$

where $U_{a2}$ denotes the slope angle of an upper marginal ray (RAY2) on the first lens M1, $h_{a2}$ denotes the height of an upper marginal ray (RAY2) on the second lens M2, and $h_{b1}$ denotes the height of a lower marginal ray (RAY3) on the first lens M1;

determining the distance between the fifth lens M5 and the sixth lens M6 as $d_5$, wherein $|d_5|=$WDI$\cdot$ratio$_3$;

defining a virtual plane D1 in the light path of the objective at the same position as that of the fifth lens M5, aligning the incidental chief ray RAY1 on the sixth lens M6 parallel to an optical axial OA, and determining the radius of the sixth lens M6 as $r_6$, wherein $$r_6 = h_{b6} \Big/ \sin\left(\frac{\arctan((h_{b6}-(h_{bD1}-CLEAPE5))/(-d_5-z_{b6}))}{2} + \frac{U'_{b6}}{2}\right)$$

where $h_{b6}$ denotes the height of the lower marginal ray RAY3 on the sixth lens M6, $h_{bD1}$ denotes the height of the lower marginal ray RAY3 on the virtual plane D1, $z_{b6}$ denotes the axial distance between incidental point of the lower marginal ray on the sixth lens M6 and the vertex of the sixth lens M6, and $U'_{b6}$ denotes the slope angle of the lower marginal ray RAY3 on the sixth lens M6;

determining the radius of the fifth lens M5 as $r_5$, wherein $$r_5 = h_{b5} \Big/ \sin\left(\frac{\arctan((h_{b5}-(h_{a6}-CLEAPE6))/(-d_5-z_{a6}))}{2} + \frac{U'_{b5}}{2}\right)$$

where $h_{b5}$ denotes the height of lower marginal ray RAY3 on the fifth lens M5, $h_{a6}$ denotes the height of lower marginal ray RAY3 on the sixth lens M6, $U'_{b5}$ denotes the slope angle of the lower marginal ray RAY3 on the fifth lens M5, $z_{a6}$ denotes the axial distance between an incidental point of the upper marginal ray RAY2 on the sixth lens M6 and the vertex of the sixth lens M6, and $U'_{b5}$ denotes the slope angle of the lower marginal ray RAY3 on the fifth lens M5; and determining the radius of the third lens M3 as $r_3$ according to an object-image conjugation relationship, a magnification relationship, a pezval sum condition and a conjugation relationship of entrance and exit pupil, the radii of and distances between the first lens M1, the second lens M2, the fifth lens M5, and the sixth lens M6, the radius of the fourth lens M4 as $r_4$ based on a paraxial iterative algorithm, and the distance between the third lens M3 and the fourth lens M4 as $d_3$, the distance between the second lens M2 and the third lens M3 as $l_3$, and the distance between the fourth lens M4 and the fifth lens M5 as $d_5$, and the image distance of the fourth lens M4 as $l_4'$.

2. The method of claim 1, wherein the step of determining the radius of the third lens M3 further comprising the steps of: dividing the six lenses into three groups G1, G2 and G3 such that G1 includes lenses M1 and M2, G2 includes lenses M3 and M4, and G3 includes lenses M5 and M6, taking the second lens group G2 as an individual optical system and defining the constraint conditions: (1) making the paraxial magnification of G2 as $\beta = M$; (2) making the paraxial entrance pupil distance of the second lens group G2 ($enp_2$) equal to the exit pupil distance of the first lens group G1, i.e. $enp_2 = ENP1$; (3) making the paraxial exit pupil distance of the second lens group G2 ($exp_2$) equal to the entrance pupil distance of the G3, i.e. $exp_2 = EXP3$; and (4) making 1500 mm>$(-l_3-enp_2)$>0 and 0>$d_3$>1500 mm.

3. The method of claim 2, further comprising an iterative process comprising the steps of:

STEP 201 choosing a value for the radius of the third lens M3 as $r_3$, setting an error factor $\mu_\beta$ and $\mu_{exp2}$, taking $\beta(1)=M$ and $exp_2(1)=EXP1$, wherein the EXP1 is the exit pupil distance of the first lens group M1, and setting a loop time k=1;

STEP 202 calculating structural parameters $d_3(k)$, $l_3(k)$, $l_4'(k)$, and $r_4(k)$ of the second lens group G2 based on $\beta(k)$, $exp_2(k)$, $r_3$, the conjugation relationship of the object and the image, the magnification, the pezval sum condition, and the conjugation relationship of the entrance and exit pupil;

STEP 203 obtaining magnification M(k) and real exit pupil distance EXP2(k) of the second lens group G2 based on $r_3$, $d_3(k)$, $l_3(k)$, $l_4'(k)$, and $r_4(k)$;

STEP 204 if $|EXP2(k)-EXP1| \leq \xi_{exp_2}$ and $|M(k)-M| \leq \xi_\beta$, ending the iterative process, and taking the current $r_3$, $d_3(k)$, $l_3(k)$, $l_4'(k)$, and $r_4(k)$ as the structural parameters of the second lens group G2; if not, going to STEP 205;

STEP 205 taking $\beta(k+1) = \beta(k) \cdot [M/M(k)]^\sigma$, and $exp_2(k+1) = exp_2(k) \cdot [EXP1/EXP2(k)]^\sigma$, wherein constant $\sigma \leq 1$, and making k=k+1, and going back to the STEP 202.

4. The method of claim 3, wherein the constant $\sigma$ is selected from ¼, ½ or 1.

* * * * *